(12) United States Patent
Luch

(10) Patent No.: US 7,898,053 B2
(45) Date of Patent: *Mar. 1, 2011

(54) SUBSTRATE STRUCTURES FOR INTEGRATED SERIES CONNECTED PHOTOVOLTAIC ARRAYS AND PROCESS OF MANUFACTURE OF SUCH ARRAYS

(76) Inventor: Daniel Luch, Morgan Hill, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/799,863

(22) Filed: May 4, 2010

(65) Prior Publication Data
US 2010/0229942 A1 Sep. 16, 2010

Related U.S. Application Data

(63) Continuation-in-part of application No. 12/154,078, filed on May 19, 2008, now Pat. No. 7,732,243, which is a continuation-in-part of application No. 10/600,287, filed on Jun. 21, 2003, now abandoned, which is a continuation-in-part of application No. 10/144,901, filed on May 13, 2002, now abandoned, which is a continuation-in-part of application No. 09/498,102, filed on Feb. 4, 2000, now Pat. No. 6,459,032.

(51) Int. Cl.
*H01L 31/0224* (2006.01)
(52) U.S. Cl. ............... 257/448; 257/E31.124; 257/E31.126; 136/244; 136/252; 136/256
(58) Field of Classification Search .......... 438/57, 438/61, 62, 73, 80, 84, 98; 136/244, 252, 136/256, 264, 265, 258; 257/E31.11, E31.124, 257/E31.126, 431, 443, 448
See application file for complete search history.

(56) References Cited

U.S. PATENT DOCUMENTS

| 3,094,439 | A | | 6/1963 | Mann et al. | |
|---|---|---|---|---|---|
| 3,116,171 | A | * | 12/1963 | Rongved et al. | 136/245 |
| 3,330,700 | A | * | 7/1967 | Sequeira et al. | 136/244 |
| 3,346,419 | A | * | 10/1967 | Webb | 136/244 |
| 3,369,939 | A | | 2/1968 | Meyer | |
| 3,376,163 | A | | 4/1968 | Abrahamsohn | |
| 3,442,007 | A | | 5/1969 | Griffin et al. | |
| 3,459,597 | A | * | 8/1969 | Baron | 136/244 |
| 3,480,473 | A | | 11/1969 | Tanos | |

(Continued)

OTHER PUBLICATIONS

Singh, V.P. et al. "Thin film CdTe-CdS heterojunction solar cells on lightweight metal substrates", Sol. Energy Mater. Sol. Cells. 59, 145-161. (1999).

*Primary Examiner*—Mary Wilczewski

(57) ABSTRACT

This invention comprises manufacture of photovoltaic cells by deposition of thin film photovoltaic junctions on metal foil substrates. The photovoltaic junctions may be heat treated if appropriate following deposition in a continuous fashion without deterioration of the metal support structure. In a separate operation, an interconnection substrate structure is provided, optionally in a continuous fashion. Multiple photovoltaic cells are then laminated to the interconnection substrate structure and conductive joining methods are employed to complete the array. In this way the interconnection substrate structure can be uniquely formulated from polymer-based materials employing optimal processing unique to polymeric materials. Furthermore, the photovoltaic junction and its metal foil support can be produced in bulk without the need to use the expensive and intricate material removal operations currently taught in the art to achieve series interconnections.

22 Claims, 23 Drawing Sheets

U.S. PATENT DOCUMENTS

| | | | |
|---|---|---|---|
| 3,483,038 A | 12/1969 | Hui et al. | |
| 3,523,875 A | 8/1970 | Minklei | |
| 3,553,030 A * | 1/1971 | Lebrun | 136/244 |
| 3,619,382 A | 11/1971 | Lupinski | |
| 3,682,786 A | 8/1972 | Brown et al. | |
| 3,713,893 A * | 1/1973 | Shirland | 136/244 |
| 3,764,280 A | 10/1973 | Lupinski | |
| 3,849,880 A * | 11/1974 | Haynos | 29/854 |
| 3,865,699 A | 2/1975 | Luch | |
| 3,888,697 A | 6/1975 | Bogus et al. | |
| 3,903,427 A | 9/1975 | Pack | |
| 3,903,428 A | 9/1975 | DeJong | |
| 3,978,333 A | 8/1976 | Crisman et al. | |
| 3,982,964 A | 9/1976 | Lindmayer et al. | |
| 3,993,505 A * | 11/1976 | Pack, Sr. | 136/244 |
| 3,996,067 A | 12/1976 | Broder | |
| 4,009,093 A | 2/1977 | Luch | |
| 4,017,332 A | 4/1977 | James | |
| 4,019,924 A * | 4/1977 | Kurth | 136/251 |
| 4,027,652 A | 6/1977 | Collura | |
| 4,038,042 A | 7/1977 | Adelman | |
| 4,087,960 A | 5/1978 | Koichi | |
| 4,101,385 A | 7/1978 | Luch | |
| 4,127,424 A | 11/1978 | Ullery | |
| 4,158,612 A | 6/1979 | Luch et al. | |
| 4,175,249 A | 11/1979 | Gruber | |
| 4,195,117 A | 3/1980 | Luch | |
| 4,227,942 A | 10/1980 | Hall | |
| 4,231,808 A | 11/1980 | Tabei et al. | |
| 4,241,493 A * | 12/1980 | Andrulitis et al. | 438/67 |
| 4,243,432 A | 1/1981 | Jordan et al. | |
| 4,260,429 A | 4/1981 | Moyer | |
| 4,278,473 A | 7/1981 | Borden | |
| 4,278,510 A | 7/1981 | Chien et al. | |
| 4,283,590 A | 8/1981 | Bilger et al. | |
| 4,283,591 A | 8/1981 | Boer | |
| 4,291,191 A | 9/1981 | Dahlberg | |
| 4,306,108 A * | 12/1981 | Henesian | 136/245 |
| 4,315,096 A * | 2/1982 | Tyan et al. | 136/244 |
| 4,320,154 A | 3/1982 | Biter | |
| 4,348,546 A | 9/1982 | Little | |
| 4,361,717 A | 11/1982 | Gilmore et al. | |
| 4,366,335 A | 12/1982 | Feng et al. | |
| 4,380,112 A | 4/1983 | Little | |
| 4,395,362 A | 7/1983 | Satoh et al. | |
| 4,398,055 A | 8/1983 | Ijaz et al. | |
| 4,425,262 A | 1/1984 | Kawai et al. | |
| 4,428,110 A | 1/1984 | Kim | |
| 4,429,020 A | 1/1984 | Luch | |
| 4,430,519 A | 2/1984 | Young | |
| 4,443,651 A | 4/1984 | Swartz | |
| 4,457,578 A | 7/1984 | Taylor | |
| 4,499,658 A | 2/1985 | Lewis | |
| 4,507,181 A | 3/1985 | Nath et al. | |
| 4,510,079 A | 4/1985 | Kawai et al. | |
| 4,514,579 A | 4/1985 | Hanak | |
| 4,514,580 A | 4/1985 | Bartlett | |
| 4,517,403 A | 5/1985 | Morel et al. | |
| 4,542,255 A | 9/1985 | Tanner et al. | |
| 4,584,427 A | 4/1986 | Mackamul et al. | |
| 4,585,490 A | 4/1986 | Raffel et al. | |
| 4,586,988 A | 5/1986 | Nath et al. | |
| 4,598,306 A | 7/1986 | Nath et al. | |
| 4,603,092 A | 7/1986 | Luch | |
| 4,603,470 A | 8/1986 | Yamazaki | |
| 4,605,813 A | 8/1986 | Takeuchi et al. | |
| 4,617,420 A | 10/1986 | Dilts et al. | |
| 4,617,421 A | 10/1986 | Nath et al. | |
| 4,624,045 A | 11/1986 | Ishihara et al. | |
| 4,640,002 A | 2/1987 | Phillips et al. | |
| 4,652,693 A | 3/1987 | Bar-On | |
| 4,667,128 A | 5/1987 | Kamijo et al. | |
| 4,675,468 A | 6/1987 | Basol et al. | |
| 4,695,674 A | 9/1987 | Bar-on | |
| 4,697,041 A | 9/1987 | Okaniwa et al. | |
| 4,697,042 A * | 9/1987 | Schilling | 136/244 |
| 4,704,369 A | 11/1987 | Nath et al. | |
| 4,724,011 A | 2/1988 | Turner et al. | |
| 4,745,078 A | 5/1988 | Stetter et al. | |
| 4,746,618 A | 5/1988 | Nath et al. | |
| 4,758,526 A | 7/1988 | Thalheimer | |
| 4,762,747 A | 8/1988 | Liu et al. | |
| 4,765,845 A | 8/1988 | Takada et al. | |
| 4,769,086 A | 9/1988 | Tanner et al. | |
| 4,773,944 A | 9/1988 | Nath | |
| 4,806,432 A | 2/1989 | Eguchi | |
| 4,830,038 A | 5/1989 | Anderson et al. | |
| 4,860,509 A | 8/1989 | Laaly et al. | |
| 4,876,430 A * | 10/1989 | Herschitz et al. | 219/110 |
| 4,877,460 A * | 10/1989 | Flodl | 136/244 |
| 4,965,655 A | 10/1990 | Grimmer et al. | |
| 5,084,107 A | 1/1992 | Deguchi et al. | |
| 5,118,540 A | 6/1992 | Hutchison | |
| 5,158,618 A | 10/1992 | Rubin et al. | |
| 5,164,443 A | 11/1992 | Watanabe | |
| 5,181,968 A | 1/1993 | Nath et al. | |
| 5,185,042 A | 2/1993 | Ferguson | |
| 5,223,044 A | 6/1993 | Asai | |
| 5,232,518 A | 8/1993 | Nath et al. | |
| 5,238,519 A | 8/1993 | Nath et al. | |
| 5,254,179 A | 10/1993 | Ricaud et al. | |
| 5,270,229 A | 12/1993 | Ishihara | |
| 5,273,608 A | 12/1993 | Nath | |
| 5,330,583 A | 7/1994 | Asai et al. | |
| 5,380,371 A | 1/1995 | Murakami | |
| 5,385,848 A | 1/1995 | Grimmer | |
| 5,391,235 A | 2/1995 | Inoue | |
| 5,391,236 A | 2/1995 | Krut et al. | |
| 5,419,781 A | 5/1995 | Hamakawa et al. | |
| 5,421,908 A | 6/1995 | Yoshida et al. | |
| 5,428,249 A | 6/1995 | Sawayama et al. | |
| 5,457,057 A | 10/1995 | Nath et al. | |
| 5,466,302 A | 11/1995 | Carey et al. | |
| 5,468,652 A | 11/1995 | Gee | |
| 5,474,620 A | 12/1995 | Nath et al. | |
| 5,474,621 A | 12/1995 | Barnard | |
| 5,530,519 A | 6/1996 | Miyawaki et al. | |
| 5,547,516 A | 8/1996 | Luch | |
| 5,554,229 A | 9/1996 | Vogeli | |
| 5,567,296 A | 10/1996 | Luch | |
| 5,575,861 A | 11/1996 | Younan et al. | |
| 5,593,901 A | 1/1997 | Oswald et al. | |
| 5,620,528 A | 4/1997 | Schade et al. | |
| 5,626,686 A | 5/1997 | Yoshida | |
| 5,626,688 A | 5/1997 | Probst et al. | |
| 5,637,537 A | 6/1997 | Nath et al. | |
| 5,667,596 A | 9/1997 | Tsuzuki et al. | |
| 5,674,325 A | 10/1997 | Albright et al. | |
| 5,679,176 A | 10/1997 | Tsuzuki et al. | |
| 5,681,402 A | 10/1997 | Ichinose et al. | |
| 5,733,381 A | 3/1998 | Ota et al. | |
| 5,735,966 A | 4/1998 | Luch | |
| 5,759,291 A | 6/1998 | Ichinose et al. | |
| 5,814,195 A | 9/1998 | Lehan et al. | |
| 5,865,904 A | 2/1999 | Tanda | |
| 5,868,869 A | 2/1999 | Albright et al. | |
| 5,897,715 A | 4/1999 | Ward et al. | |
| 5,919,316 A * | 7/1999 | Bogorad et al. | 136/256 |
| 5,928,439 A | 7/1999 | Ota et al. | |
| 5,942,048 A | 8/1999 | Fujisaki et al. | |
| 5,951,786 A | 9/1999 | Gee et al. | |
| 6,008,451 A | 12/1999 | Ichinose et al. | |
| 6,034,322 A | 3/2000 | Pollard | |
| 6,093,581 A | 7/2000 | Takabayashi | |

| | | | | | | |
|---|---|---|---|---|---|---|
| 6,093,884 | A | 7/2000 | Toyomura et al. | 7,507,903 B2 | 3/2009 | Luch |
| 6,111,189 | A | 8/2000 | Garvison et al. | 7,635,810 B2 | 12/2009 | Luch |
| 6,121,542 | A | 9/2000 | Shiotsuka et al. | 7,732,243 B2 | 6/2010 | Luch |
| 6,137,221 | A | 10/2000 | Roitman et al. | 7,781,672 B2 * | 8/2010 | Gaudiana et al. ............ 136/256 |
| 6,184,458 | B1 | 2/2001 | Murakami et al. | 2002/0014262 A1 | 2/2002 | Matsushita et al. |
| 6,231,732 | B1 | 5/2001 | Hollars et al. | 2004/0063320 A1 | 4/2004 | Hollars |
| 6,232,544 | B1 | 5/2001 | Takabayashi | 2004/0144043 A1 | 7/2004 | Stevenson et al. |
| 6,239,352 | B1 | 5/2001 | Luch | 2005/0072461 A1 | 4/2005 | Kuchinski et al. |
| 6,265,812 | B1 | 7/2001 | Watanabe et al. | 2005/0074915 A1 | 4/2005 | Tuttle |
| 6,268,014 | B1 | 7/2001 | Eberspacher et al. | 2005/0109392 A1 | 5/2005 | Hollars |
| 6,313,395 | B1 | 11/2001 | Crane et al. | 2005/0241692 A1 | 11/2005 | Rubin et al. |
| 6,335,479 | B1 | 1/2002 | Yamada et al. | 2005/0263178 A1 | 12/2005 | Montello et al. |
| 6,340,403 | B1 | 1/2002 | Carey et al. | 2005/0263179 A1 | 12/2005 | Gaudiana et al. |
| 6,350,944 | B1 | 2/2002 | Sheri et al. | 2005/0263180 A1 | 12/2005 | Montello et al. |
| 6,359,209 | B1 | 3/2002 | Glenn et al. | 2005/0274408 A1 | 12/2005 | Li et al. |
| 6,365,010 | B1 | 4/2002 | Hollars | 2006/0030141 A1 | 2/2006 | Weng et al. |
| 6,372,538 | B1 | 4/2002 | Wendt et al. | 2006/0121701 A1 | 6/2006 | Basol |
| 6,384,313 | B2 | 5/2002 | Nakagawa et al. | 2006/0174931 A1 | 8/2006 | Mapes et al. |
| 6,414,235 | B1 | 7/2002 | Luch | 2007/0283996 A1 | 12/2007 | Hachtmann et al. |
| 6,422,793 | B1 | 7/2002 | Todisco et al. | 2007/0283997 A1 | 12/2007 | Hachtmann et al. |
| 6,459,032 | B1 | 10/2002 | Luch | 2007/0295385 A1 | 12/2007 | Sheats |
| 6,468,828 | B1 | 10/2002 | Glatfelter et al. | 2007/0295390 A1 | 12/2007 | Sheats et al. |
| 6,479,744 | B1 | 11/2002 | Tsuzuiki et al. | 2008/0000518 A1 | 1/2008 | Basol |
| 6,488,824 | B1 | 12/2002 | Hollars et al. | 2008/0011350 A1 | 1/2008 | Luch |
| 6,511,861 | B2 | 1/2003 | Takeyama et al. | 2008/0053512 A1 | 3/2008 | Kawashima |
| 6,548,912 | B1 | 4/2003 | Graff et al. | 2008/0053519 A1 | 3/2008 | Pearce et al. |
| 6,553,729 | B1 | 4/2003 | Nath et al. | 2008/0142071 A1 | 6/2008 | Dorn et al. |
| 6,555,739 | B2 * | 4/2003 | Kawam ....................... 136/244 | 2008/0227236 A1 | 9/2008 | Luch |
| 6,573,445 | B1 | 6/2003 | Burgers | 2008/0314432 A1 | 12/2008 | Paulson et al. |
| 6,582,887 | B2 | 6/2003 | Luch | 2008/0314433 A1 | 12/2008 | Luch |
| 6,586,270 | B2 | 7/2003 | Tsuzuki et al. | 2009/0014049 A1 | 1/2009 | Gur et al. |
| 6,697,248 | B1 | 2/2004 | Luch | 2009/0014057 A1 | 1/2009 | Croft et al. |
| 6,729,081 | B2 | 5/2004 | Nath et al. | 2009/0014058 A1 | 1/2009 | Croft et al. |
| 6,743,524 | B2 | 6/2004 | Schaepkens | 2009/0107538 A1 | 4/2009 | Luch |
| 6,750,662 | B1 | 6/2004 | Van Der Heide | 2009/0111206 A1 | 4/2009 | Luch |
| 6,784,358 | B2 | 8/2004 | Kukulka | 2009/0114261 A1 | 5/2009 | Stancel |
| 6,787,405 | B2 | 9/2004 | Chen | 2009/0145551 A1 | 6/2009 | Luch |
| 6,803,513 | B2 | 10/2004 | Beernink et al. | 2009/0159119 A1 | 6/2009 | Basol |
| 6,974,976 | B2 | 12/2005 | Hollars | 2009/0169722 A1 | 7/2009 | Luch |
| 7,022,910 | B2 | 4/2006 | Gaudiana et al. | 2009/0173374 A1 | 7/2009 | Luch |
| 7,120,005 | B1 | 10/2006 | Luch | 2009/0199894 A1 | 8/2009 | Hollars et al. |
| 7,144,751 | B2 | 12/2006 | Gee et al. | 2009/0223552 A1 | 9/2009 | Luch |
| 7,157,641 | B2 | 1/2007 | Gregg | 2009/0293941 A1 | 12/2009 | Luch |
| 7,170,001 | B2 | 1/2007 | Gee et al. | 2010/0071757 A1 | 3/2010 | Krajewski et al. |
| 7,276,724 | B2 | 10/2007 | Sheats et al. | | | |
| 7,394,425 | B2 | 7/2008 | Luch | * cited by examiner | | |

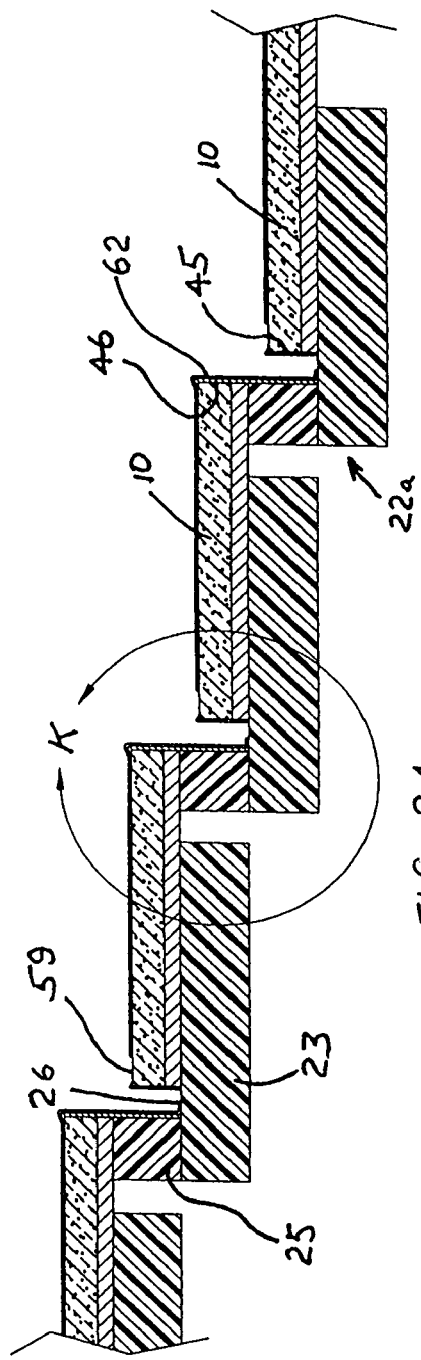
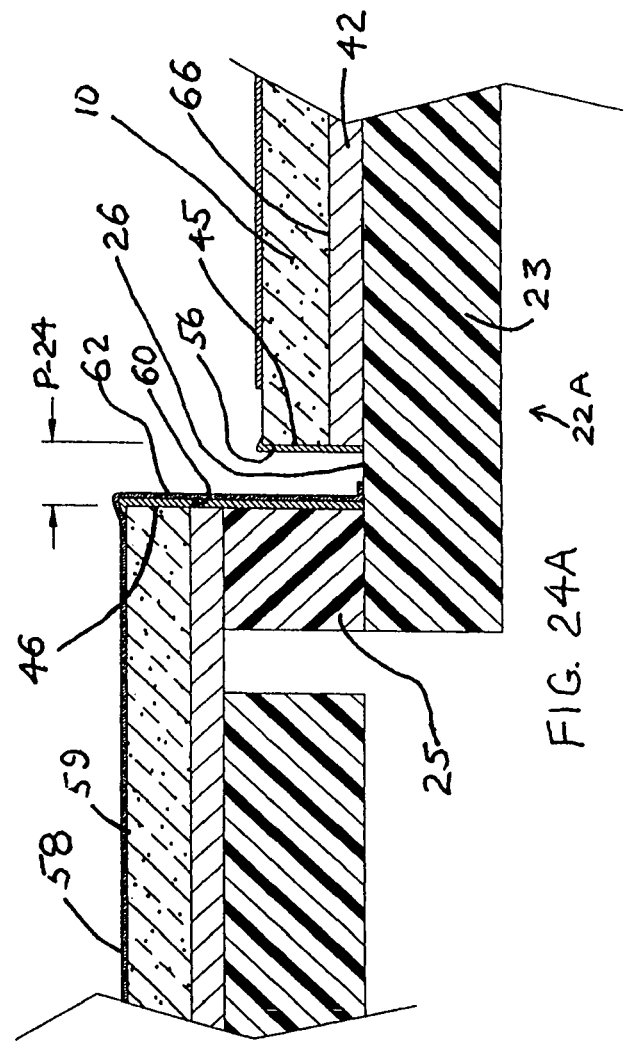
FIG. 24
FIG. 24A

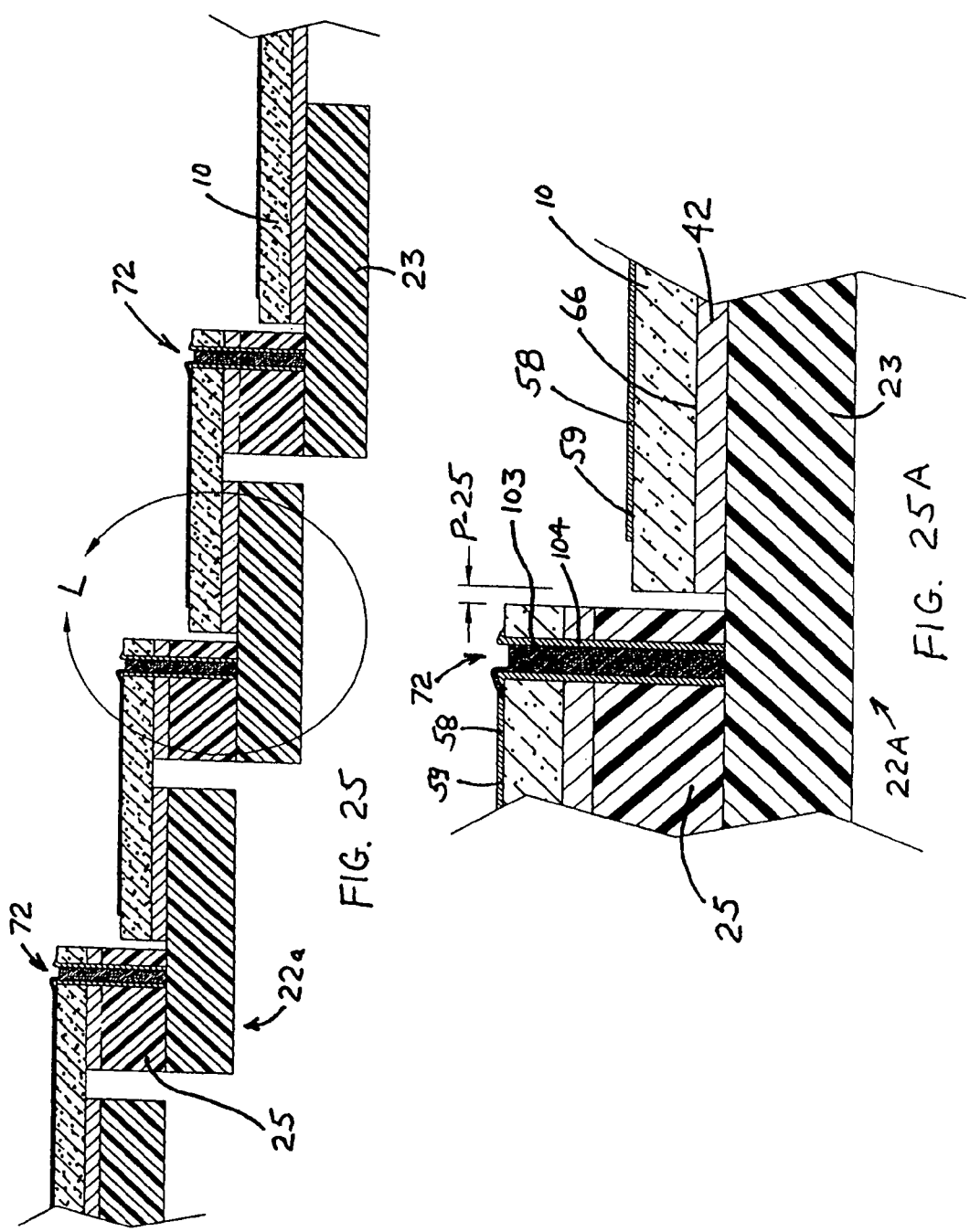

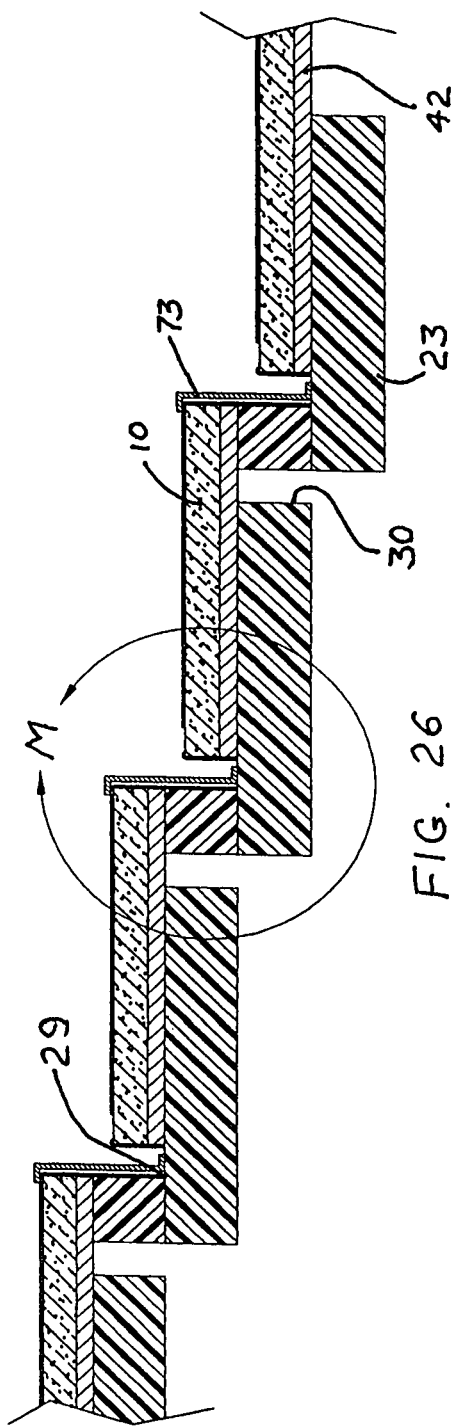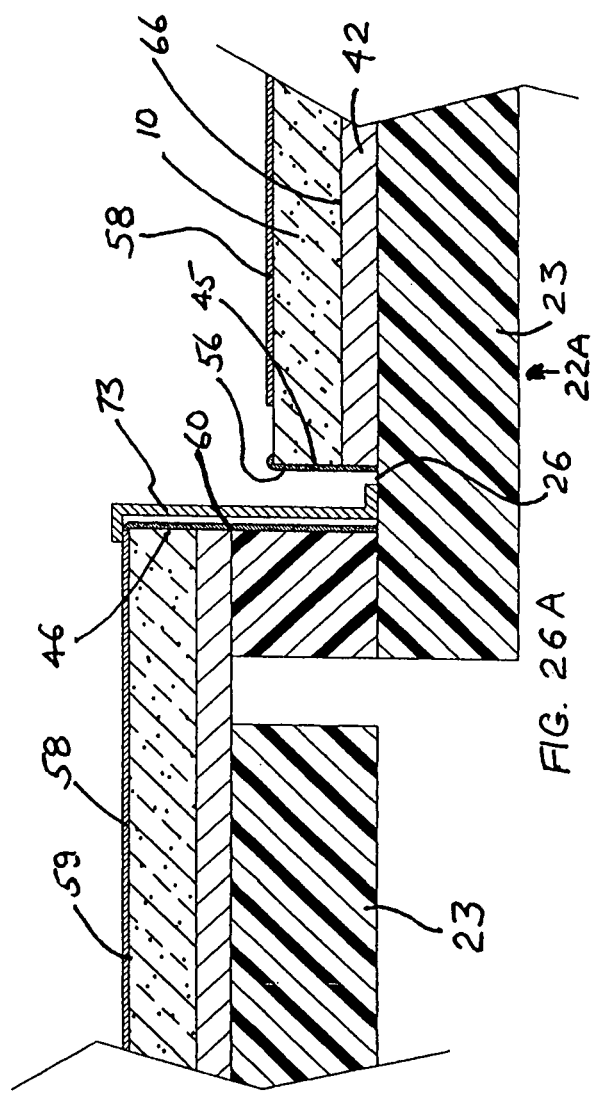
FIG. 26
FIG. 26A

SUBSTRATE STRUCTURES FOR INTEGRATED SERIES CONNECTED PHOTOVOLTAIC ARRAYS AND PROCESS OF MANUFACTURE OF SUCH ARRAYS

CROSS-REFERENCE TO RELATED APPLICATIONS

This application is a Continuation-in-Part of U.S. patent application Ser. No. 12/154,078 filed May 19, 2008 now U.S. Pat. No. 7,732,243 entitled Substrate Structures for Integrated Series Connected Photovoltaic Arrays and Process of Manufacture of Such Arrays, which is a Continuation-in-Part of U.S. patent application Ser. No. 10/600,287 filed Jun. 21, 2003, entitled Methods and Structures for Production of Selectively Electroplated Articles, now abandoned, which is a Continuation-in-Part of U.S. patent application Ser. No. 10/144,901 filed May 13, 2002, entitled Methods and Structures for Production of Selectively Electroplated Articles, now abandoned, which is a Continuation-in-Part of U.S. patent application Ser. No. 09/498,102 filed Feb. 4, 2000, entitled Substrate Structures for Integrated Series Connected Photovoltaic Arrays and Process of Manufacture of Such Arrays, and now U.S. Pat. No. 6,459,032. The entire contents of the above identified applications are incorporated herein by this reference.

BACKGROUND OF THE INVENTION

Photovoltaic cells have developed according to two distinct methods. A first form produces cells employing a matrix of crystalline silicon appropriately doped to produce a planar p-n junction. An intrinsic electric field established at the p-n junction produces a voltage by directing solar photon produced holes and free electrons in opposite directions. Good conversion efficiencies and long-term reliability have been demonstrated for crystalline silicon cells. However, widespread energy collection using crystalline silicon cells is thwarted by the high cost of crystal silicon (especially single crystal silicon) material and interconnection processing.

A second approach to produce photovoltaic cells is by depositing thin photovoltaic semiconductor films on a supporting substrate. Many various techniques have been proposed for deposition of semiconductor thin films. The deposition methods include vacuum vapor deposition, vacuum sputtering, electroplating, chemical vapor deposition and printing of nanoparticle inks. These structures have become know in the art as "thin film" devices. Material requirements are minimized and technologies can be proposed for mass production. Typical semiconductors used for thin film photovoltaic devices include cuprous sulfide, cadmium telluride (CdTe), copper-indium-gallium-diselenide (CIGS), amorphous silicon, printed silicon, and dye sensitized polymeric materials. The thin film structures can be designed according to doped homojunction technology or can employ heterojunction approaches such as those using CdTe or chalcopyrite materials.

Despite significant improvements in individual cell conversion efficiencies for both single crystal and thin film approaches, photovoltaic energy collection has been generally restricted to applications having relatively low power requirements. One factor impeding development of bulk power systems is the problem of economically collecting the energy from an extensive collection surface. Photovoltaic cells can be described as high current, low voltage devices. Typically individual cell voltage is less than about two volts, and often less than 0.6 volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

Regardless of whether the cells are crystalline silicon or thin film, making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. A first problem which has confronted production of expansive surface photovoltaic modules is that of collecting the photogenerated current from the top, light incident surface. Transparent conductive oxide (TCO) layers are normally employed to form a top surface. However, these TCO layers are relatively resistive compared to pure metals. Thus, efforts must be made to minimize resistive losses in transport of current through the TCO layer. One approach is simply to reduce the surface area of individual cells to a manageable amount. However, as cell widths decrease, the width of the area between individual cells (interconnect area) should also decrease so that the relative portion of inactive surface of the interconnect area does not become excessive. Typical cell widths of one centimeter or less are often taught in the art. These small cell widths demand very fine interconnect area widths, which dictate delicate and sensitive techniques to be used to electrically connect the top TCO surface of one cell to the bottom electrode of an adjacent series connected cell. Furthermore, achieving good stable ohmic contact to the TCO cell surface has proven difficult, especially when one employs those sensitive techniques available when using the TCO only as the top collector electrode.

One approach to expand the surface area of individual cells while avoiding excessive resistive losses in current collection is to form a current collector grid over the surface. This approach positions highly conductive material in contact with the surface of the TCO in a spaced arrangement such that the travel distance of current through the TCO is reduced. In the case of the classic single crystal silicon or polycrystal silicon cells, a common approach is to form a collector grid pattern of traces using a silver containing paste and then fuse the paste to sinter the silver particles into continuous conductive silver paths. These highly conductive traces normally lead to a collection buss such as a copper foil strip. One notes that this approach involves use of expensive silver and requires the photovoltaic semiconductors to tolerate the high fusion temperatures. The sintering temperatures involved are normally unsuitable for thin film photovoltaic structures. Another approach is to attach an array of fine copper wires to the surface of the TCO. The wires may also lead to a collection buss, or alternatively extend to an electrode of an adjacent cell. This wire approach requires positioning and fixing of multiple fine fragile wires which makes mass production difficult and expensive. Another approach commonly used for thin film photovoltaic cells is to print a collector grid array on the surface of the TCO using a conductive ink, usually one containing a heavy loading of fine particulate silver. The ink is simply dried or cured at mild temperatures to remove a solvent carrier. Compared to the high sintering temperatures associated with the silver pastes employed with crystal silicon cells, the milder curing temperatures for silver inks typically do not adversely affect thin film photovoltaic structures. However, the silver ink approaches require the use of relatively expensive inks because of the required high loading of finely divided silver. Furthermore, batch printing on the individual cells is laborious and expensive.

In addition to current collection from the top surface of cells, efficient photovoltaic power collection includes integration of multiple cells into arrays or modules to create a desired surface area. The multiple cells are typically electrically integrated in series arrangement such that the power is accumulated in voltage increments. Regarding crystalline silicon cells, the individual cells are normally initially discrete and comprise rigid wafers approximately 200 micrometers thick and approximately 230 square centimeters in area. A conventional way to harvest power from multiple such cells is to use a conventional "string and tab" arrangement. This technique involves first depositing fine conductive current collecting grid fingers over the light incident surface. As previously discussed, these fingers often are in the form of a fired silver paste or fine metal wires. Multiple grid fingers lead to a robust buss of substantial current carrying capacity. This buss material then extends and is electrically joined to the bottom electrode of an adjacent cell. Such methods for electrically integrating multiple discrete cells can be termed "discrete integration".

A typical prior art "string and tab" arrangement for achieving series connections among crystalline silicon cells is embodied in FIGS. 1A through 1C. It is in seen in FIG. 1A that conductive grid fingers 82 are attached to the light incident (top) surface 83 of cells 84. These fingers 82 extend to buss material 85 positioned at opposite peripheral edges of cells 84. The buss material extends to the bottom electrode 86 of an adjacent cell, as is shown in the bottom view of FIG. 1B and side view of FIG. 1C. It is to be noted that the busses 85 in FIGS. 1A through 1C are depicted with section lines. This is done for contrast only and the views are not actually sectional views. While FIGS. 1A through 1C show the interconnection of two cells, in reality this connection is normally made among strings of many more cells (8 for example). This process is thus laborious, costly and subject to manufacturing error. Further, the strings of cells are physically turned over in order to access both top and bottom surfaces of the individual cells to accomplish the electrical connections. Such a process may lead to breaking of electrical connections and complicates efforts to achieve a continuous high volume production process for the integrated cells.

Thin film photovoltaic semiconductors can be deposited over expansive areas and often in a continuous roll-to-roll fashion. Thin film technologies may thus offer additional opportunities for mass production of interconnected arrays compared to inherently small, discrete single crystal silicon cells. For example, thin film photovoltaic cells may be subdivided and interconnected into arrays of multiple cells using a process generally referred to as "monolithic integration". Monolithic integration envisions initially depositing photovoltaic cell structure over an expanded surface of supporting substrate. The expansive photovoltaic structure is subsequently subdivided into smaller, isolated, individual cells which are then serially interconnected while maintaining the cells on the initial common substrate.

A number of U.S. Patents have issued proposing designs and processes to achieve such monolithic series integration among thin film photovoltaic cells. Examples of these proposed processes are presented in U.S. Pat. Nos. 4,443,651, 4,724,011, and 4,769,086 to Swartz, Turner et al. and Tanner et al. respectively which taught monolithic integration techniques for photovoltaic cells supported by glass substrates. The process comprises deposition of photovoltaic materials on glass substrates followed by scribing to form smaller area individual cells. Multiple steps then follow to electrically connect the individual cells in series array. While expanding the opportunities for mass production of interconnected cell arrays compared with single crystal silicon approaches, glass substrates must inherently be processed on an individual batch basis. Further, when multiple individual cells are formed monolithically on a common monolithic glass substrate, there is no way to check the quality of individual cells and remove deficient cell regions. Thus variations in cell quality over an expansive surface may jeopardize the entire module.

More recently, developers have explored depositing wide area films using continuous roll-to-roll processing. This technology generally involves depositing thin films of photovoltaic material onto a continuously moving sheetlike web of insulating plastic or metal foil. However, a challenge still remains regarding monolithically subdividing the expansive films into individual cells followed by interconnecting into a series connected array. For example, U.S. Pat. No. 4,965,655 to Grimmer et. al. and U.S. Pat. No. 4,697,041 to Okinawa teach processes employing insulating polymeric substrates requiring expensive laser scribing and interconnections achieved with laser heat staking. In addition, these two references teach a substrate of thin vacuum deposited metal on substrate films of relatively expensive polymers. The electrical resistance of thin vacuum metallized layers may significantly limit the active area of the individual interconnected cells. Finally, when multiple individual cells are formed on a common monolithic polymer support film it is difficult to check the quality of individual cells and remove deficient cell regions. Thus variations in cell quality over an expansive surface may jeopardize the entire module.

It has become well known in the art that the efficiencies of certain promising thin film photovoltaic junctions such as those based on copper-indium-gallium-diselenide or cadmium telluride can be substantially increased by high temperature treatments. These treatments involve temperatures at which even the most heat resistant and expensive plastics suffer rapid deterioration. Therefore, from a practical standpoint these thin film photovoltaic semiconductors are most often deposited on ceramic, glass, or metal substrates to support the thin film junctions. Use of a glass or ceramic substrates generally restricts one to batch processing and handling difficulty. Use of a metal foil, such as stainless steel, as a substrate allows continuous roll-to-roll manufacture of cell structure over an expansive surface. However, despite the fact that use of a metal foil allows high temperature processing in roll-to-roll fashion, the subsequent interconnection of individual cells effectively into an interconnected array has proven difficult, in part because the metal foil substrate is electrically conducting. For example, the monolithic integration techniques possible with insulating substrates are not possible using metal foil substrates, since the common substrate is a conducting metal and would not permit the required electrical isolation of individual cells prior to electrical series interconnection.

Many manufacturers of thin film photovoltaic devices supported on metal foil substrates choose to subdivide the material into discrete cells prior to assembly into an interconnected array. Typical of these methods is that which replicates the "string and tab" legacy approaches used for module assembly of crystalline silicon cells. Here the expansive metal foil/photovoltaic structure is subdivided into individual cells, typically of dimensions about 15 cm. by 15. cm, before subsequent assembly via the "string and tab" approach described above.

Some attempts have been advanced to achieve the advantages of continuous production of interconnected modules using continuously produced cell structure supported on a metal foil substrate. U.S. Pat. No. 4,746,618 to Nath et al. teaches a design and process to achieve interconnected arrays using roll-to-roll processing of a metal web substrate such as stainless steel. U.S. Pat. No. 4,746,618 is hereby incorporated in its entirety by reference. The process includes multiple operations of cutting, selective deposition, material removal and riveting. These operations add considerably to the final interconnected array cost. U.S. Pat. No. 5,385,848 to Grimmer teaches roll-to-roll methods to achieve integrated series connections of adjacent thin film photovoltaic cells supported on an electrically conductive metal substrate. U.S. Pat. No. 5,385,848 is hereby incorporated in its entirety by reference. The process includes mechanical or chemical etch removal of a portion of the photovoltaic semiconductor and transparent top electrode to expose an upper surface portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense since a significant amount of the valuable photovoltaic semiconductor is lost to the removal process. Ultimate module efficiencies are further compromised in that the spacing between adjacent cells grows, thereby reducing the effective active collector area for a given module area.

Yet another approach to achieve current collection and series interconnections among multiple cells while maintaining the flexible characteristic of many thin film structures is represented by the teachings of Yoshida et al. in U.S. Pat. No. 5,421,908. U.S. Pat. No. 5,421,908 is hereby incorporated in its entirety by reference. An embodiment of the current collection teachings of Yoshida et al. is presented in FIGS. 2A through 2C. Yoshida et al. teach a process wherein a conductive rear "$1^{st}$" electrode 94 is first deposited using vacuum processing onto a polymeric film 96 as shown in FIG. 2A. Through holes 92 are then formed through the laminate. As shown in FIG. 2B, an overlaying amorphous silicon photovoltaic film 97 and TCO "$2^{nd}$" electrode layer 98 are deposited on the laminate and through the holes. As shown in FIG. 2C, electrical communication between a top surface TCO "$2^{nd}$" electrode 98 and a backside "$3^{rd}$" electrode 99 is made through the holes when the "$3^{rd}$" electrode 99 is deposited on the rear of the structure, as shown in FIG. 2C. The rear "$3^{rd}$" electrode 99 is deposited by vacuum processing which also may coat the side walls of the holes. As Yoshida et al. teach, the "$2^{nd}$" and "$3^{rd}$" electrode layers in the holes are insulated from the "$1^{st}$" electrode 94 by the high resistance of the amorphous silicon semiconductor layer. One readily realizes that an appropriate insulating layer would have to coat the holes to separate these electrodes should a semiconductor of lower resistivity be employed. To complete a series connection to an adjacent cell, the "$3^{rd}$" electrode 99 of a first cell is further electrically joined to rear "$1^{st}$" electrode 94 of an adjacent cell through additional holes between scribe lines separating the adjoining cells.

The through holes taught by Yoshida represent means to transport current from the topside surface of a photovoltaic cell to a conductive material ("$3^{rd}$" electrode) located remote from the top surface. Thus the through holes of Yoshida et al. are functionally equivalent to the silver grid lines and wire forms discussed above in relation to FIGS. 1A through 1C.

A number of manufacturing and performance problems are intrinsic with the method and structure taught by Yoshida et al. First, both the "$1^{st}$" rear cell electrode and the "$3^{rd}$" backside electrode are relatively thin, being formed by vacuum sputtering. Vacuum processing is expensive and in practice yields relatively thin deposits. As taught by Yoshida et al. deposits of less than one half micrometer were employed. This relatively low practical thickness limits the current carrying ability of the deposited metal and thereby restricts the size of the individual cells. Moreover, absent additional conductive fill material in the holes, the connection between the backside "$3^{rd}$" electrode and the rear "$1^{st}$" electrode of adjacent cells is achieved only through a very restricted cross section. This is a result of the limited access to the "$1^{st}$" electrode, since there is no access to the broad surface regions of the "$1^{st}$" electrode, only its edge surface. The primary support for the Yoshida structure is the insulating polymeric film, which thus must be present during formation of the semiconductors. While perhaps acceptable when manufacturing amorphous silicon cells taught by Yoshida et al., it may be unlikely that the films taught would be suitable for the heat treatment requirements of other notable thin film semiconductors. The hole density taught by Yoshida et al. is quite large (15 mm centers) adding to complexity. However, even with the large hole density, the resistive losses expected in current transport to the holes would be quite large given the sheet resistance of a normal TCO. To address this issue, Yoshida et al. proposed a structure combining printed silver ink grid lines leading to a reduced number of through holes (see for example FIG. 28A of U.S. Pat. No. 5,421,908). Finally, many individual cells are formed on a common monolithic support film using the Yoshida et al. teaching. There is no way to check the quality of individual cells and remove deficient cell regions. Thus variations in cell quality over an expansive surface jeopardize the entire module.

Thus there remains a need for manufacturing processes and articles which allow facile production of photovoltaic semiconductor structures while also offering unique means to achieve effective integrated connections to result in final modular array.

In a somewhat removed segment of technology, a number of electrically conductive fillers have been used to produce electrically conductive polymeric materials. This technology generally involves mixing of a conductive filler such as silver particles with the polymer resin prior to fabrication of the material into its final shape. Many choices exist for the conductive filler, including those comprising metals such as silver, copper and nickel, those comprising conductive metal oxides such as indium-tin oxide and zinc oxide, intrinsically conductive polymers, graphite, carbon black and the like. Conductive fillers may have high aspect ratio structure such as metal fibers such as stainless steel fibers or metallized polymer fibers. Other high aspect ratio materials such as metal flakes or powder, or highly structured carbon blacks may be appropriate, with the choice based on a number of cost/performance considerations. More recently, fine particles of intrinsically conductive polymers have been employed as conductive fillers within a resin binder. Electrically conductive polymers have been used as bulk thermoplastic compositions, or formulated into paints and inks. Their development has been spurred in large part by electromagnetic radiation shielding and static discharge requirements for plastic components used in the electronics industry. Other known applications include resistive heating fibers and battery components and production of conductive patterns and traces. The characterization "electrically conductive polymer" covers a very wide range of intrinsic resistivities depending on the filler, the filler loading and the methods of manufacture of the filler/polymer blend. Resistivities for filled electrically conductive polymers may be as low as 0.00001 ohm-cm. for very heavily filled silver inks, yet may be as high as 10,000 ohm-cm or even more for lightly filled carbon black materials or other "anti-static" materials. "Electrically conductive polymer" has become a broad industry term to characterize all such materials. In addition, it has been reported that recently developed intrinsically conducting polymers (absent conductive filler) may exhibit resistivities comparable to conductive metals In yet another separate technological segment, coating plastic substrates with metal electrodeposits has been employed to achieve decorative effects on items such as knobs, cosmetic closures, faucets, and automotive trim. The normal conventional process actually combines two primary deposition technologies. The first is to deposit an adherent metal coating using chemical (electroless) deposition to first coat the nonconductive plastic and thereby render its surface highly conductive. This electroless step is then followed by conventional electroplating. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction (typically referred to as "electroless plating"). This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully prepared parts and designs. In addition, the many steps employing harsh chemicals make the process intrinsically costly and environmentally difficult. Finally, the sensitivity of ABS plastic to liquid hydrocarbons has prevented certain applications. ABS and other such polymers have been referred to as "electroplateable" polymers or resins. This is a misnomer in the strict sense, since ABS (and other nonconductive polymers) are incapable of accepting an electrodeposit directly and must be first metallized by other means before being finally coated with an electrodeposit. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated. None of these attempts at simplification have achieved any recognizable commercial application.

A number of proposals have been made to make the plastic itself conductive enough to allow it to be electroplated directly thereby avoiding the "electroless plating" process. It is known that one way to produce electrically conductive polymers is to incorporate conductive or semiconductive fillers into a polymeric binder. Investigators have attempted to produce electrically conductive polymers capable of accepting an electrodeposited metal coating by loading polymers with relatively small conductive particulate fillers such as graphite, carbon black, silver or nickel powder or flake or small metal coated forms such as metal coated mica. When considering polymers rendered electrically conductive by loading with electrically conductive fillers, it may be important to distinguish between "microscopic resistivity" and "bulk" or macroscopic resistivity". "Microscopic resistivity" refers to a characteristic of a polymer/filler mix considered at a relatively small linear dimension of for example 1 micrometer or less. "Bulk" or "macroscopic resistivity" refers to a characteristic determined over larger linear dimensions. To illustrate the difference between "microscopic" and "bulk, macroscopic" resistivities, one can consider a polymer loaded with conductive fibers at a fiber loading of 10 weight percent. Such a material might show a low "bulk, macroscopic" resistivity when the measurement is made over a relatively large distance. However, because of fiber separation (holes) such a composite might not exhibit consistent "microscopic" resistivity. When producing an electrically conductive polymer intended to be electroplated, one should consider "microscopic resistivity" in order to achieve uniform, "hole-free" deposit coverage. Thus, it may be advantageous to consider conductive fillers comprising those that are relatively small, but with loadings sufficient to supply the required conductive contacting. Such fillers include metals such as silver in the form of powders or flake, metal coated particles such as mica or spheres, particles comprising conductive metal oxides such as indium-tin oxide and zinc oxide, fine particles of intrinsically conductive polymers, graphite powder and conductive carbon black and the like. Heavy loadings of such filler may be sufficient to reduce volume resistivity to a level where electroplating may be considered.

However, attempts to make an acceptable electroplateable polymer using the small conductive fillers alone encounter a number of barriers. First, the most conductive fine metal containing fillers such as silver are relatively expensive. The loadings required to achieve the particle-to-particle proximity to achieve acceptable conductivity increases the cost of the polymer/filler blend dramatically. The metal containing fillers are accompanied by further problems. They tend to cause deterioration of the mechanical properties and processing characteristics of many resins. This significantly limits options in resin selection. All polymer processing is best achieved by formulating resins with processing characteristics specifically tailored to the specific process (injection molding, extrusion, blow molding, printing etc.). A required heavy loading of metal filler severely restricts ability to manipulate processing properties in this way. A further problem is that metal fillers can be abrasive to processing machinery and may require specialized screws, barrels, and the like.

Another major obstacle involved in the electroplating of electrically conductive polymers is a consideration of adhesion between the electrodeposited metal and polymeric substrate (metal/polymer adhesion). In most cases sufficient adhesion is required to prevent metal/polymer separation during extended environmental and use cycles. Despite being electrically conductive, a simple metal-filled polymer offers no assured bonding mechanism to produce adhesion of an electrodeposit since the metal filler particles may be encapsulated by the resin binder or oxide, often resulting in a resin-rich or oxide "skin".

A number of methods to enhance electrodeposit adhesion to electrically conductive polymers have been proposed. For example, etching of the surface prior to plating can be considered. Etching can be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids.

In the case of conductive polymers containing finely divided metal, one can propose achieving direct metal-to-metal adhesion between electrodeposit and filler. However, here the metal particle surface may be shielded by an aforementioned resin or oxide "skin". To overcome this effect, one could propose methods to remove the "skin", exposing active metal filler to bond to subsequently electrodeposited metal. For the reasons described above, electrically conductive polymers employing metal fillers have not been widely used as bulk substrates for electroplateable articles. Nevertheless, revived efforts and advances have been made recently to accomplish electroplating onto printed conductive patterns formed by silver filled inks and pastes. In addition, such metal containing polymers have found considerable applications as inks or pastes in production of printed conductive traces for electrical circuitry, antennas etc.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

An additional obstacle confronting practical electroplating onto electrically conductive polymers is the initial "bridge" of electrodeposit onto the surface of the electrically conductive polymer. In electrodeposition, the substrate to be plated is often made cathodic through a pressure contact to a highly conductive member under cathodic potential. However, if the contact resistance is excessive or the substrate is insufficiently conductive, the electrodeposit current favors the highly conductive member to the point where the electrodeposit will not bridge to the substrate.

Moreover, a further problem is encountered even if specialized racking or cathodic contact successfully achieves electrodeposit bridging to the substrate. Many of the electrically conductive polymers have resistivities far higher than those of typical metal substrates. Also, many applications contemplate electroplating onto a thin printed conductive ink pattern of traces or "fingers". The dry conductive ink thickness is typically less than 25 micrometer and often less than 6 micrometer. The conductive polymeric pattern may be relatively limited in the amount of electrodeposition current which it alone can convey. Thus, the conductive polymeric substrate pattern does not cover almost instantly with electrodeposit as is typical with metallic substrates. Except for the most heavily loaded and highly conductive polymer substrates, a large portion of the electrodeposition current must pass back through the previously electrodeposited metal growing laterally over the surface of the conductive plastic substrate. In a fashion similar to the bridging problem discussed above, the electrodeposition current favors the electrodeposited metal and the lateral growth can be extremely slow and erratic. This restricts the size and "growth length" of the conductive ink pattern, increases plating costs, and can also result in large non-uniformities in electrodeposit integrity and thickness over the pattern.

This lateral growth is dependent on the ability of the substrate to convey current. Thus, the thickness and resistivity of a conductive polymeric ink pattern can be defining factors in the ability to achieve satisfactory electrodeposit coverage rates. When dealing with selectively electroplated patterns long thin metal traces are often desired, deposited on a relatively thin electrically conductive polymer substrate patterns. These factors of course often work against achieving the desired result.

This coverage rate problem likely can be characterized by a continuum, being dependent on many factors such as the nature of the initially electrodeposited metal, electroplating bath chemistry, the nature of the polymeric binder and the resistivity of the electrically conductive polymeric substrate. As a "rule of thumb", the instant inventor estimates that coverage rate issue would demand attention if the resistivity of a bulk conductive polymeric substrate rose above about 0.001 ohm-cm. Alternatively, as a "rule of thumb" appropriate for conductive thin film substrate patterns, coverage rate issues may require attention if the substrate pattern to be plated has a surface "sheet" resistance of greater than about 0.05 ohm per square.

The least expensive (and least conductive) of the readily available conductive fillers for plastics are carbon blacks. Attempts have been made to electroplate electrically conductive polymers using carbon black loadings. Examples of this approach are the teachings of U.S. Pat. Nos. 4,038,042, 3,865,699, and 4,278,510 to Adelman, Luch, and Chien et al. respectively.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. A fundamental problem remaining unresolved by the Adelman teaching is the relatively high resistivity of carbon loaded polymers. The lowest "microscopic resistivity" generally achievable with carbon black loaded polymers is about 1 ohm-cm. This is about five to six orders of magnitude higher than typical electrodeposited metals such as copper or nickel. Thus, the electrodeposit bridging and coverage rate problems described above remained unresolved by the Adelman teachings.

Luch in U.S. Pat. No. 3,865,699 and Chien et al. in U.S. Pat. No. 4,278,510 also chose carbon black as a filler to provide an electrically conductive surface for the polymeric compounds to be electroplated. The Luch U.S. Pat. No. 3,865,699 and the Chien U.S. Pat. No. 4,278,510 are hereby incorporated in their entirety by this reference. However, these inventors further taught inclusion of materials to increase the rate of electrodeposit coverage or the rate of metal deposition on the polymer. These materials can be described herein as "electrodeposit growth rate accelerators" or "electrodeposit coverage rate accelerators". An electrodeposit coverage rate accelerator is a material functioning to increase the electrodeposition coverage rate over the surface of an electrically conductive polymer independent of any incidental affect it may have on the conductivity of an electrically conductive polymer. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome problems in achieving electrodeposit coverage of electrically conductive polymeric surfaces having relatively high resistivity or thin electrically conductive polymeric substrates having limited current carrying capacity.

In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These directly electroplateable resins (DER) can be generally described as electrically conductive polymers with the inclusion of a growth rate accelerator.

Specifically for the present invention, specification, and claims, directly electroplateable resins, (DER), are characterized by the following features:

(a) presence of an electrically conductive polymer;
(b) presence of an electrodeposit coverage rate accelerator;
(c) presence of the electrically conductive polymer and the electrodeposit coverage rate accelerator in the directly electroplateable composition in cooperative amounts required to achieve direct coverage of the composition with an electrodeposited metal or metal-based alloy.

In his patents, Luch identified elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

When used alone, the minimum workable level of carbon black required to achieve "microscopic" electrical resistivities of less than 1000 ohm-cm. for a polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities.

It is understood that in addition to carbon blacks, other well known, highly conductive fillers can be considered in DER compositions. Examples include but are not limited to metallic fillers such as silver powder or flake, metal coated forms such as metal coated mica or glass spheres, graphite powder and conductive metal oxides. In these cases the more highly conductive fillers can be used to augment or even replace the conductive carbon black. Furthermore, one may consider using intrinsically conductive polymers to supply the required conductivity. In this case, it may not be necessary to add conductive fillers to the polymer.

The "bulk, macroscopic" resistivity of fine conductive particle filled polymers can be further reduced by augmenting the filler with additional highly conductive, high aspect ratio forms such as metal containing fibers. This can be an important consideration in the success of certain applications. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer "matrix" encapsulating the non-conductive filler particles.

Regarding electrodeposit coverage rate accelerators, both Luch and Chien et al. in the above discussed U.S. Patents demonstrated that sulfur and other sulfur bearing materials such as sulfur donors and vulcanization accelerators function as electrodeposit coverage rate accelerators when using an initial Group VIII metal electrodeposit "strike" layer. Thus, an electrodeposit coverage rate accelerator need not be electrically conductive, but may be a material that is normally characterized as a non-conductor. The coverage rate accelerator need not appreciably affect the conductivity of the polymeric substrate. As an aid in understanding the function of an electrodeposit coverage rate accelerator the following is offered:

a. A specific conductive polymeric structure is identified as having insufficient current carrying capacity to be directly electroplated in a practical manner.
b. A material is added to the conductive polymeric material forming said structure. Said material addition may have insignificant affect on the current carrying capacity of the structure (i.e. it does not appreciably reduce resistivity or increase thickness).
c. Nevertheless, inclusion of said material greatly increases the speed at which an electrodeposited metal laterally covers the electrically conductive surface.

It is contemplated that a coverage rate accelerator may be present as an additive, as a species absorbed on a filler surface, or even as a functional group attached to a polymer chain. One or more growth rate accelerators may be present in a directly electroplateable resin (DER) to achieve combined often synergistic results.

A hypothetical example is an extended trace of conductive ink having a dry thickness of two micrometer. Such inks typically comprise a conductive filler such as silver, nickel, copper, conductive carbon etc. The limited thickness of the ink may reduce the current carrying capacity of this trace thus preventing direct electroplating in a practical manner. However, inclusion of an appropriate quantity of a coverage rate accelerator may allow the conductive trace to be directly electroplated in a practical manner.

One might expect that other Group 6A elements, such as oxygen, selenium and tellurium, could function in a way similar to sulfur. In addition, other combinations of electrodeposited metals, such as copper and appropriate coverage rate accelerators may be identified. It is important to recognize that such an electrodeposit coverage rate accelerator is important in order to achieve direct electrodeposition in a practical way onto polymeric substrates having low conductivity or very thin electrically conductive polymeric substrates having restricted current carrying ability.

It has also been found that the inclusion of an electrodeposit coverage rate accelerator promotes electrodeposit bridging from a discrete cathodic metal contact to a DER surface. This greatly reduces the bridging problems described above.

Due to multiple performance problems associated with their intended end use, none of the attempts identified above to directly electroplate electrically conductive polymers or plastics has ever achieved any recognizable commercial success. Nevertheless, the current inventor has persisted in personal efforts to overcome certain performance deficiencies associated with the initial DER technology. Along with these efforts has come a recognition of unique and eminently suitable applications employing the DER technology. Some examples of these unique applications for electroplated articles include solar cell electrical current collection grids, electrodes, electrical circuits, electrical traces, circuit boards, antennas, capacitors, induction heaters, connectors, switches, resistors, inductors, batteries, fuel cells, coils, signal lines, power lines, radiation reflectors, coolers, diodes, transistors, piezoelectric elements, photovoltaic cells, emi shields, biosensors and sensors. One readily recognizes that the demand for such functional applications for electroplated articles is relatively recent and has been particularly explosive during the past decade.

It is important to recognize a number of important characteristics of directly electroplateable resins (DERs) which facilitate the current invention. One such characteristic of the DER technology is its ability to employ polymer resins and formulations generally chosen in recognition of the fabrication process envisioned and the intended end use requirements. A very wide choice of polymer resins and blends, additives and fillers is available with the directly electroplateable resin (DER) technology. Functional combinations of polymers and additives, such as curatives, stabilizers, and adhesion promoters can be widely chosen. In order to provide clarity, examples of some such fabrication processes are presented immediately below in subparagraphs 1 through 9.

(1) Should it be desired to electroplate an ink, paint, coating, or paste which may be printed or formed on a substrate, a good film forming polymer, for example a soluble resin such as an elastomer, can be chosen to fabricate a DER ink (paint, coating, paste etc.). For example, in some embodiments thermoplastic elastomers having an olefin base, a urethane base, a block copolymer base or a random copolymer base may be appropriate. In some embodiments the coating may comprise a water based latex. Other embodiments may employ more rigid film forming polymers. The DER ink composition can be tailored for a specific process such flexographic printing, rotary silk screening, gravure printing, flow coating, spraying etc. Furthermore, additives can be employed to improve the adhesion of the DER ink to various substrates. One example would be tackifiers.

(2) Very thin DER traces often associated with electrical traces such as current collector grid structures can be printed and then electroplated due to the inclusion of the electrodeposit growth rate accelerator.

(3) Should it be desired to cure the DER substrate to a 3 dimensional matrix, an unsaturated elastomer or other "curable" resin may be chosen.

(4) DER inks can be formulated to form electrical traces on a variety of flexible substrates. For example, should it be desired to form electrical structure on a laminating film, a DER ink adherent to the sealing surface of the laminating film can be effectively electroplated with metal and subsequently laminated to a separate surface.

(5) Should it be desired to electroplate a fabric, a DER ink can be used to coat all or a portion of the fabric intended to be electroplated. Furthermore, since DER's can be fabricated out of the thermoplastic materials commonly used to create fabrics, the fabric itself could completely or partially comprise a DER. This would eliminate the need to coat the fabric.

(6) Should one desire to electroplate a thermoformed article or structure, DER's would represent an eminently suitable material choice. DER's can be easily formulated using olefinic materials which are often a preferred material for the thermoforming process. Furthermore, DER's can be easily and inexpensively extruded into the sheetlike structure necessary for the thermoforming process.

(7) Should one desire to electroplate an extruded article or structure, for example a sheet or film, DER's can be formulated to possess the necessary melt strength advantageous for the extrusion process.

(8) Should one desire to injection mold an article or structure having thin walls, broad surface areas etc. a DER composition comprising a high flow polymer can be chosen.

(9) Should one desire to vary adhesion between an electrodeposited DER structure supported by a substrate the DER material can be formulated to supply the required adhesive characteristics to the substrate. For example, the polymer chosen to fabricate a DER ink can be chosen to cooperate with an "ink adhesion promoting" surface treatment such as a material primer or corona treatment.

All polymer fabrication processes require specific resin processing characteristics for success. The ability to "custom formulate" DER's to comply with these changing processing and end use requirements while still allowing facile, quality electroplating is a significant factor in the teachings of the current invention.

Another important recognition regarding the suitability of DER's for the teachings of the current invention is the simplicity of the electroplating process. Unlike many conventional electroplated plastics, DER's do not require a significant number of process steps prior to actual electroplating. This allows for simplified manufacturing and improved process control. It also reduces the risk of cross contamination such as solution dragout from one process bath being transported to another process bath. The simplified manufacturing process will also result in reduced manufacturing costs.

Another important recognition regarding the suitability of DER's for the teachings of the current invention is the wide variety of metals and alloys capable of being electrodeposited. Deposits may be chosen for specific attributes. Examples may include copper or silver for conductivity and nickel or chromium for corrosion resistance, and tin or tin based alloys for solderability.

Yet another recognition of the benefit of DER's for the teachings of the current invention is the ability they offer to selectively electroplate an article or structure. The articles of the current invention often consist of metal patterns selectively positioned in conjunction with insulating materials. Such selective positioning of metals is often expensive and difficult. However, the attributes of the DER technology make the technology eminently suitable for the production of such selectively positioned metal structures. As will be shown in later embodiments, it is often desired to electroplate a polymer or polymer-based structure in a selective manner. DER's are eminently suitable for such selective electroplating.

Yet another recognition of the benefit of DER's for the teachings of the current invention is the ability they offer to continuously electroplate an article or structure. As will be shown in later embodiments, it is often desired to continuously electroplate articles. DER's are eminently suitable for such continuous electroplating. Furthermore, DER's allow for selective electroplating in a continuous manner.

Yet another recognition of the benefit of DER's for the teachings of the current invention is their ability to withstand the pre-treatments often required to prepare other materials for plating. For example, were a DER to be combined with a metal, the DER material would be resistant to many of the pre-treatments such as cleaning which may be necessary to electroplate the metal.

Yet another recognition of the benefit of DER's for the teachings of the current invention is that the desired plated structure often requires the plating of long and/or broad surface areas. As discussed previously, the coverage rate accelerators included in DER formulations allow for such extended surfaces to be covered in a relatively rapid manner thus allowing one to consider the use of electroplating of conductive polymers.

These and other attributes of DER's may contribute to successful articles and processing of the instant invention. However, it is emphasized that the DER technology is but one of a number of alternative metal deposition or positioning processes suitable to produce many of the embodiments of the instant invention. Other approaches, such as printing of conductive resin formulations, metal spraying, etching metal foils, stamping metal foils, laminating metal foils, positioning and affixing metal patterns, electroless metal deposition, vacuum metal evaporation and sputtering, or electroplating onto various conductive ink patterns such as those comprising silver may be suitable alternatives. These choices will become clear in light of the teachings to follow in the remaining specification, accompanying figures and claims.

In order to eliminate ambiguity in terminology, for the present invention the following definitions are supplied:

While not precisely definable, for the purposes of this specification, electrically insulating materials may generally be characterized as having electrical resistivities greater than 10,000 ohm-cm. Also, electrically conductive materials may generally be characterized as having electrical resistivities less than 10,000 ohm-cm. A subset of conductive materials, electrically resistive or semi-conductive materials may generally be characterized as having electrical resistivities in the range of 0.001 ohm-cm to 10,000 ohm-cm. The term "electrically conductive polymer or resin" as used in the art and in this specification and claims extends to materials of a very wide range of resitivities from about 0.00001 ohm-cm. to about 10,000 ohm-cm and higher.

An "electroplateable material" is a material having suitable attributes that allow it to be coated with a layer of electrodeposited material, either directly or following a preplating process.

A "metallizable material" is a material suitable to be coated with a metal deposited by any one or more of the available metallizing process, including chemical deposition, vacuum metallizing, sputtering, metal spraying, sintering and electrodeposition.

"Metal-based" refers to a material or structure having at least one metallic property and comprising one or more components at least one of which is a metal or metal-containing alloy.

"Alloy" refers to a substance composed of two or more intimately mixed materials.

"Group VIII metal-based" refers to a substance containing by weight 50% to 100% metal from Group VIII of the Periodic Table of Elements.

A "metal-based foil" refers to a thin structure of metal or metal-based material that may maintain its integrity absent a supporting structure. Generally, metal of thickness greater than about 2 micrometers may have this characteristic (i.e. 2 micrometers, 10 micrometers, 25 micrometers, 100 micrometers, 250 micrometers).

A "film" refers to a thin material form that is not necessarily self supporting.

In this specification and claims, the terms "monolithic" or "monolithic structure" are used as is common in industry to describe an object that is seamless and made or formed into or from a single item.

A "continuous" process is one wherein a continuous form of a material component is supplied to the process. The material feed can be continuous motion or repetitively intermittent, and the output is timed to remove product either by continuous motion or repetitively intermittent according to the rate of input.

A "roll-to-roll" process is one wherein a material component is fed to the process from a roll of material and the output of the process is accumulated in a roll form.

The "machine direction" is that direction in which material is transported through a process step.

The term "multiple" is used herein to mean "two or more".

A "web" is a thin, flexible sheetlike material form often characterized as continuous in a length direction.

"Sheetlike" characterized a structure having surface dimensions far greater than the thickness dimension.

"Substantially planar" characterizes a surface structure which may comprise minor variations in surface topography but from an overall and functional perspective can be considered flat.

The terms "upper" and "top" surfaces of structure refer to those surfaces of structure facing toward the light incident side of the structure and are thus depicted in the drawing embodiments as facing upward.

The terms "lower" or "bottom" surface refer to surfaces facing away from the light incident side of the structure.

OBJECTS OF THE INVENTION

An object of the invention is to eliminate the deficiencies in the prior art methods of producing expansive area, interconnected photovoltaic arrays. A further object of the present invention is to provide improved substrates to facilitate electrical interconnections among thin film cells. A further object of the invention is to permit inexpensive production of high efficiency thin film photovoltaic cells while simultaneously permitting the use of polymer based substrate materials and associated processing to effectively interconnect those cells. A further object of the present invention is to provide improved processes whereby expansive area, interconnected photovoltaic arrays can be economically mass produced.

Other objects and advantages will become apparent in light of the following description taken in conjunction with the drawings and embodiments.

SUMMARY OF THE INVENTION

The current invention provides a solution to the stated need by first independently producing the active photovoltaic cell structure in a way to maximize efficiency and performance. An embodiment of the invention contemplates deposition of thin film photovoltaic junctions on bulk metal foil substrates which can be heat treated following deposition in a continuous fashion without deterioration of the metal support structure. In an embodiment of the invention the photovoltaic junction with its metal foil support can be produced in bulk using continuous roll-to-roll processing. The cell structure is subsequently combined with a unique interconnecting substrate to produce a desired expansive interconnected array or module of individual cells. In an embodiment of the invention, the unique interconnecting substrate may be produced using continuous processing. In an embodiment of the invention, combining of individual cells with the interconnecting substrate is accomplished using continuous or semi-continuous processing thereby avoiding the expensive and difficult batch assembly characteristic of many module assembly operations.

In an embodiment of invention the interconnection substrate structure can comprise a wide selection of polymer-based materials since it does not have to endure high temperature exposure.

The interconnecting substrates of the current invention are characterized as having a substantially planar or sheetlike structure of one or more units, each of said units comprising both electrically conductive and non-conductive surface regions. In an embodiment, multiple photovoltaic cells overlay an individual unit of interconnecting substrate. In this embodiment, a conductive region of the substrate unit is electrically joined to the overlaying metal foil substrate of a first cell. The metal foil substrate of a second cell overlays and is attached to the non-conductive surface region of the unit. This positioning thereby insulates the metal foil substrate of the second cell from the conductive region of the unit. Series connection is completed between the first and second cells by establishing current paths between the top surface of the second cell and the conductive material of the unit. A number of options exist to achieve the current paths.

In an embodiment of the invention, the positioning of multiple cells on a unit of substrate may be accomplished using continuous or semi-continuous processing.

In embodiments of the invention, photovoltaic cells can be combined with the interconnecting substrate structures of the invention to achieve electrical interconnections while minimizing the need to use expensive and intricate material removal operations currently taught in the art to achieve series interconnections.

The interconnecting substrate structures of the current invention permit making electrical connections from the top of a cell to the bottom electrode of an adjacent cell from above without the requirement to remove material to expose a top surface of the bottom electrode. This advantage also eliminates the need to turn over strings of multiple cells during the interconnection process. Finally, the ability to make both these contacts from the top is more conducive to automated, high volume production of integrated arrays.

BRIEF DESCRIPTION OF THE DRAWINGS

The various factors and details of the structures and manufacturing methods of the present invention are hereinafter more fully set forth with reference to the accompanying drawings wherein:

FIG. 24 is a sectional view similar to FIG. 23 embodying an alternate structure for achieving an interconnected array.

FIG. 24A is an exploded view of the structure contained within the circle K of FIG. 24.

FIG. 25 is a sectional view similar to FIG. 24 embodying another alternate structure for achieving an interconnected array.

FIG. 25A is an exploded view of the structure contained within the circle L of FIG. 25.

FIG. 26 is a sectional view similar to FIGS. 24 and 25 embodying another alternate structure for achieving an interconnected array.

FIG. 26A is an exploded view of the structure contained within the circle M of FIG. 26.

DESCRIPTION OF PREFERRED EMBODIMENTS

Figure 1A:
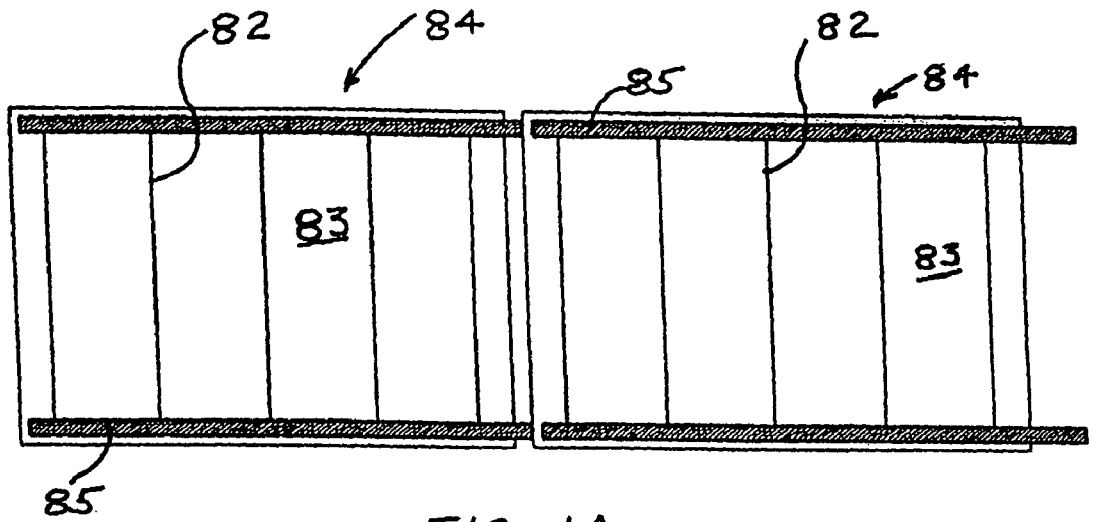
FIG. 1A is a top plan view of a prior art arrangement for interconnecting multiple photovoltaic cells.

Reference will now be made in detail to the preferred embodiments of the invention, examples of which are illustrated in the accompanying drawings. In the drawings, like reference numerals designate identical, equivalent or corresponding parts throughout several views and an additional letter designation is characteristic of a particular embodiment.

Figure 3:
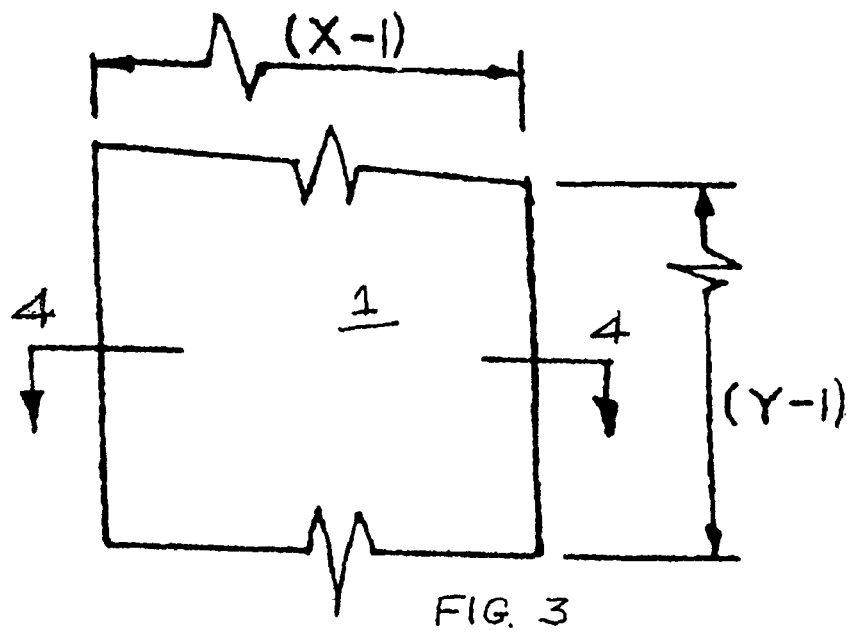
FIG. 3 is a top plan view of a thin film photovoltaic structure including its support structure.
Figure 4:
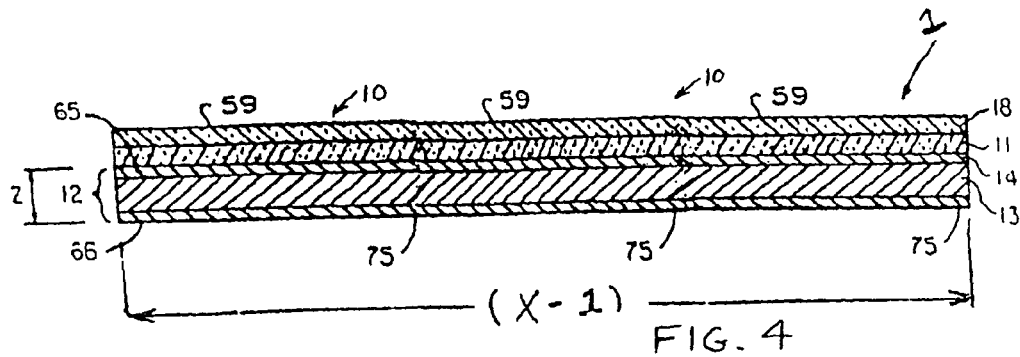
FIG. 4 is a sectional view taken substantially along the line 4-4 of FIG. 3.

Referring to FIGS. 3 and 4, an embodiment of a thin film photovoltaic structure is generally indicated by numeral 1. It is noted here that "thin film" has become commonplace in the industry to designate certain types of semiconductor materials in photovoltaic applications. While the characterization "thin film" may be used to describe many of the embodiments of the instant invention, principles of the invention may extend to photovoltaic devices not normally considered "thin film" such as single crystal or polysilicon devices, as those skilled in the art will readily appreciate. Structure 1 has a light-incident top surface 59 and a bottom conductive surface 66. Structure 1 has a width X-1 and length Y-1. It is contemplated that length Y-1 may be considerably greater than width X-1 such that length Y-1 can generally be described as "continuous" in the "Y" dimension or able to be processed in a roll-to-roll fashion in the "Y" direction. FIG. 4 shows that structure 1 of the FIG. 3 embodiment comprises a thin film semiconductor structure 11 supported by metal-based foil structure 12. Foil structure 12 has a top surface 65, bottom surface 66, and thickness "Z". Metal-based foil structure 12 may be of uniform composition or may comprise a multiple layers. For example, foil structure 12 may comprise a base layer of inexpensive and processable metal 13 with an additional metal-based layer 14 disposed between base layer 13 and semiconductor structure 11. The additional metal-based layer 14 may be chosen to ensure good ohmic contact between the top surface 65 of foil structure 12 and photovoltaic semiconductor structure 11. Bottom surface 66 of foil structure 12 may comprise a material 75 chosen to achieve good electrical and mechanical joining characteristics as will be shown. Foil structure 12 may also comprise additional conductive layers such as a conductive polymeric layer. The thickness "Z" of foil structure 12 is often between 5 micrometer and 250 micrometer (i.e. 5 micrometer, 10 micrometer, 25 micrometer, 100 micrometer, 250 micrometer) although thicknesses outside this range may be functional in certain applications. A foil thickness between 10 micrometer and 250 micrometer is often selected to provide adequate handling strength while still allowing flexibility for roll-to-roll processing, as further taught hereinafter. In the embodiment of FIGS. 3 and 4, foil structure 12 may also serve as a back electrode for the cell structure and bottom surface 66 is electrically conductive.

Should cell structure be produced having other forms of support, foil structure 12 may be replaced by alternate conductive structure to form a back electrode. For example, crystalline silicon cells or thin film cells supported by glass superstrates may be formed with conductive inks or pastes or very thin deposited metal layers as back electrodes. Normally, however, the back electrode will have an exposed portion to facilitate connection.

Figure 5:
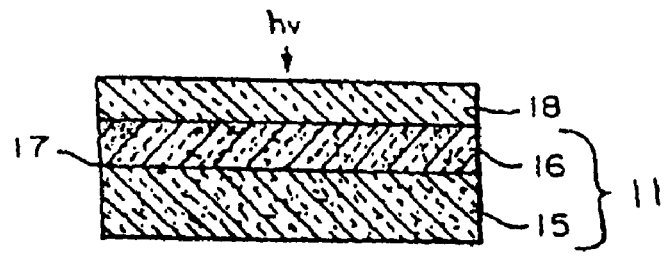
FIG. 5 is an expanded sectional view showing a form of the structure of semiconductor 11 of FIGS. 4 and 4A.

In its simplest form, a photovoltaic structure combines an n-type semiconductor with a p-type semiconductor to from a p-n junction. Most often a top surface electrode comprising an optically transparent conductive top layer such as a thin film of zinc or tin oxide is employed to minimize resistive losses involved in current collection. The transparent conductive layer is often combined with a pattern of traces formed of highly conductive material (not shown in FIG. 5) to form a composite top surface electrode. FIG. 5 illustrates an example of a typical photovoltaic structure in section. In FIGS. 4 and 5 and other selected figures, an arrow labeled "hv" is used to indicate the light incident top surface of the structure. In FIG. 5, 15 represents a thin film of a p-type semiconductor, 16 a thin film of n-type semiconductor and 17 the resulting photovoltaic junction. A top electrode 18 completes the typical photovoltaic structure. The top electrode normally comprises a transparent conductive oxide (TCO) layer 18, sometimes referred to as a "window electrode". The TCO is sometimes augmented with highly electrically conductive traces in the form of a grid (not shown in FIG. 5. The exact nature of the photovoltaic semiconductor structure 11 does not form the subject matter of the present invention. For example, cells can be multiple junction or single junction and comprise homo or hetero junctions. Semiconductor structure 11 may comprise any of the thin film structures known in the art, including but not limited to CIS, CIGS, CdTe, Cu2S, amorphous silicon, polymer based semiconductors and the like. Structure 11 may also comprise organic solar cells such as dye sensitized cells. The method used to deposit the thin film semiconductor material onto the foil 12 may be selected from processes known in the art. These include vacuum deposition, chemical vapor deposition, physical vapor deposition, sputtering, printing, electroplating and electroless plating and the like. Such processes are often suitable for high volume, continuous roll-to-roll deposition of the semiconductor materials onto the metal foil supporting substrate. Further, semiconductor structure 11 may also represent characteristically "non-thin film" cells such as those based on single crystal or polycrystal silicon since many embodiments of the invention may encompass such cells, as will be evident to those skilled in the art in light of the teachings to follow.

In the following, photovoltaic cells having a metal based support foil will be used to illustrate the embodiments and teachings of the invention. However, those skilled in the art will recognize that many of the embodiments of the instant invention do not require the presence of a "bulk" foil as represented in FIGS. 3 and 4. In many embodiments, other conductive substrate structures, such as conductive polymer films, metal meshes, vacuum, chemical or electrodeposited films and the like, as are known in the art may be suitable. Nevertheless, it is often advantageous for the back electrode of the basic cell to have an exposed conductive back surface as will be clear in the teachings to follow.

Figure 6:
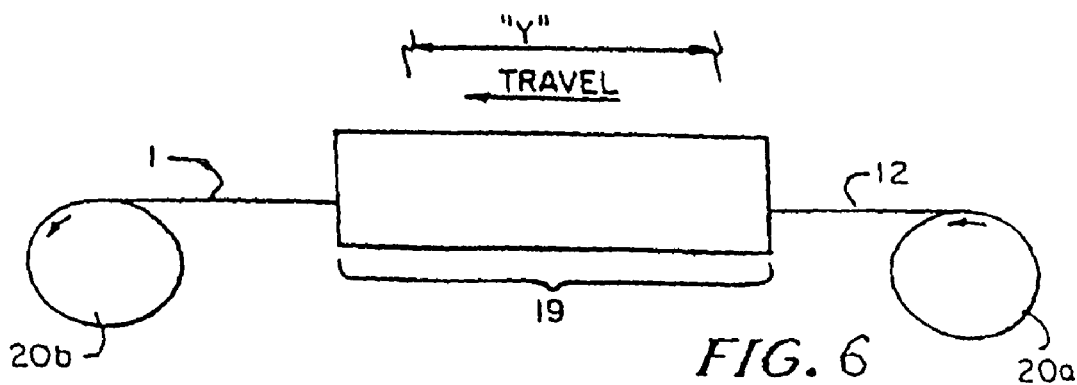
FIG. 6 illustrates a possible process for producing the structure shown in FIGS. 3-5.

FIG. 6 refers to a method of manufacture of the bulk thin film photovoltaic structures generally illustrated in FIGS. 3 and 4. In the FIG. 6 embodiment, a continuous form of self supporting metal-based foil structure 12 is moved in the direction of its length Y through a deposition process, generally indicated as 19. Process 19 accomplishes deposition of the active photovoltaic structure onto metal foil 12. Metal foil 12 is unwound from supply roll 20a, passed through deposition process 19 and rewound onto takeup roll 20b. Process 19 can comprise any of the processes well-known in the art for depositing thin film photovoltaic structures. These processes include electroplating, vacuum evaporation and sputtering, chemical deposition, and printing of nanoparticle ink precursors. Process 19 may also include treatments, such as heat treatments, intended to enhance photovoltaic cell performance.

One readily realizes that the foil structure 12 employed in a roll-to-roll process such as embodied in FIG. 6 should have a thickness and integrity appropriate for the continuous processing while retaining flexibility for roll accumulation. Generally, foils having thickness greater than about 3 to 4 micrometer (i.e. 10 micrometer, 25 micrometer, 100 micrometer, 250 micrometer) may have this ability. Alternatively, in some cases the process depicted in FIG. 6 may be accomplished with metal foil structures supported on a support structure such as a polymeric film. The polymeric film may be a surrogate support and removed after formation of the semiconductor layers.

Figure 3A:
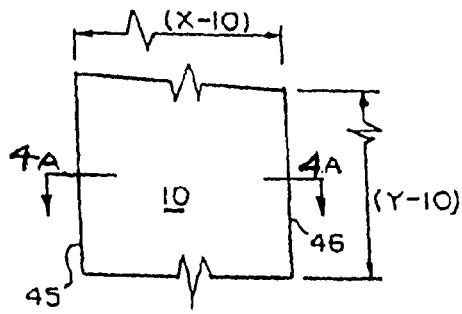
FIG. 3A is a top plan view of the article of FIG. 3 following an optional processing step of subdividing the article of FIG. 3 into cells of smaller dimension.
Figure 4A:
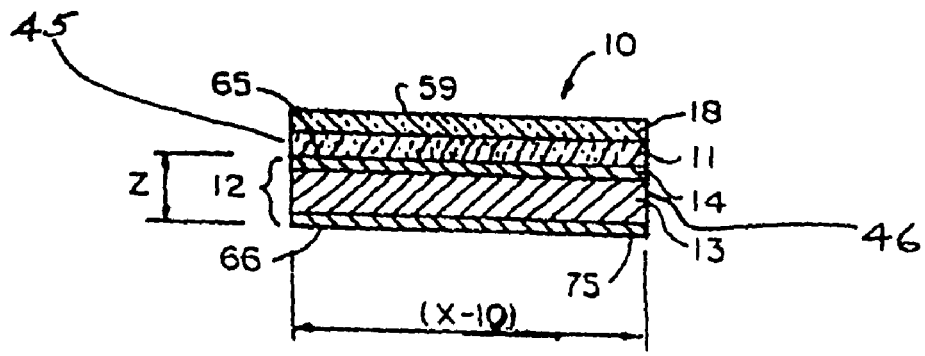
FIG. 4A is a sectional view taken substantially along the line 4A-4A of FIG. 3A.

Those skilled in the art will readily realize that the deposition process 19 of FIG. 6 may most efficiently produce photovoltaic structure 1 having dimensions far greater than those suitable for individual cells in an interconnected array. Thus, the photovoltaic structure 1 may be subdivided into cells 10 having dimensions X-10 and Y-10 as indicated in FIGS. 3A and 4A for further fabrication. Such subdivision may be accomplished by well know methods of cutting and slitting. In FIG. 3A, width X-10 defines a first terminal edge 45 of cell 10 and a second terminal edge 46 of cell 10. In one embodiment, for example, X-10 of FIG. 3A may be from 0.20 inches to 12 inches and Y-10 of FIG. 3A may be characterized as "continuous". In other embodiments the final form of cell 10 may be rectangular, such as 6 inch by 6 inch, 4 inch by 3 inch or 8 inch by 2 inch. In other embodiments, the photovoltaic structure 1 of FIG. 3 may be subdivided in the "X" dimension only thereby retaining the option of further processing in a "continuous" fashion in the "Y" direction. In the following, cells 10 in this (possibly subdivided) form having dimensions suitable for interconnection into a multi-cell array may be referred to as "cell stock" or simply as cells. "Cell stock" can be characterized as being either continuous or discrete. In this specification and claims, the surface dimensions cells or cell stock are taken to be the dimensions of the support metal foil. Such a definition may remove ambiguity should semiconductor be removed from edges of cells. The thickness of cells or cell stock is the aggregate total thickness of foil plus semiconductor plus TCO if present.

Figure 4B:
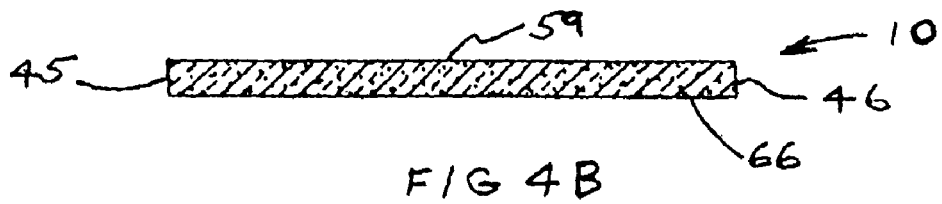
FIG. 4B is a simplified sectional depiction of the structure embodied in FIG. 4A.

FIG. 4B is a simplified depiction of cell 10 shown in FIG. 4A. In order to facilitate presentation of the aspects of the instant invention, the simplified depiction of cell 10 shown in FIG. 4B will normally be used.

Figure 1B:
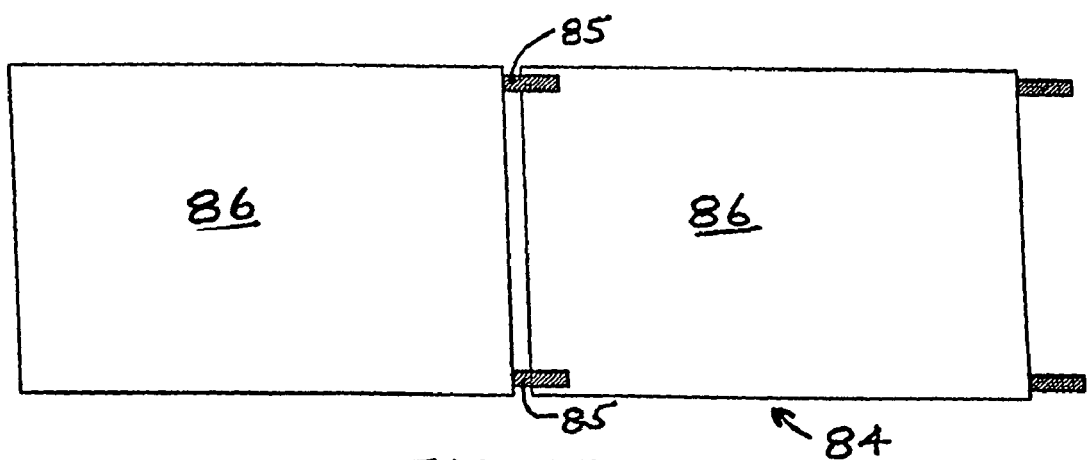
FIG. 1B is a bottom plan view of the prior art arrangement embodied in FIG. 1A.
Figure 1C:
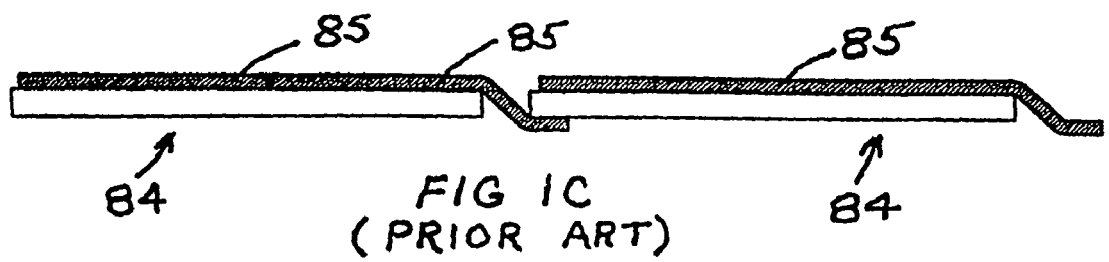
FIG. 1C is a side view of the prior art arrangement embodied in FIGS. 1A and 1B.
Figure 2A:
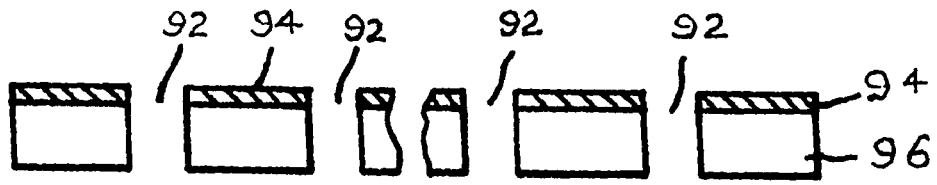
FIG. 2A embodies a step in the process of producing a prior art structure.
Figure 2B:
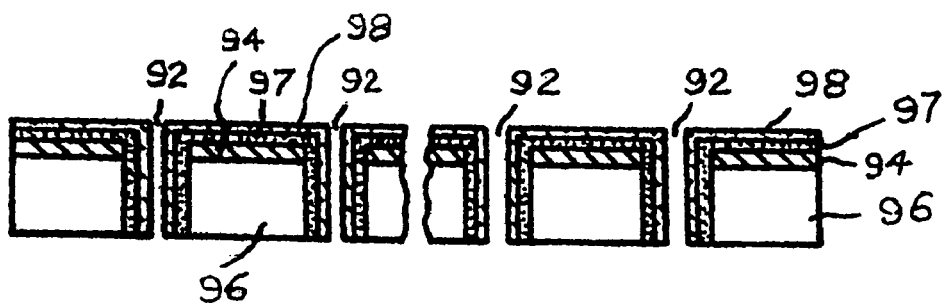
FIG. 2B is a sectional view of a further step in a prior art process.
Figure 2C:
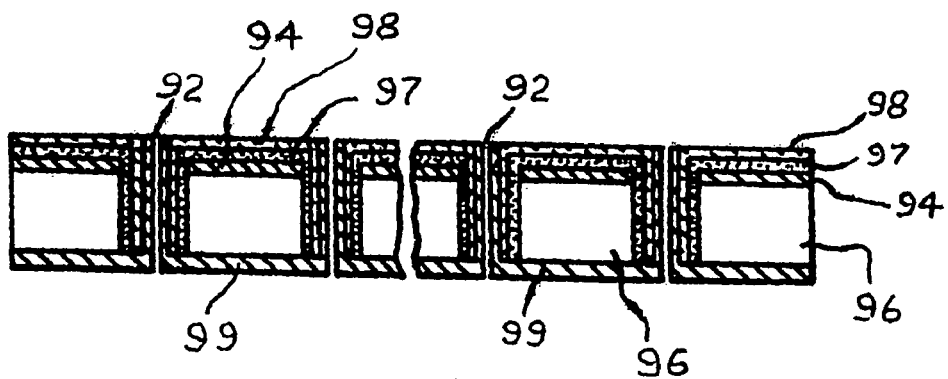
FIG. 2C is a sectional view of yet a further step in the prior art process.
Figure 7:
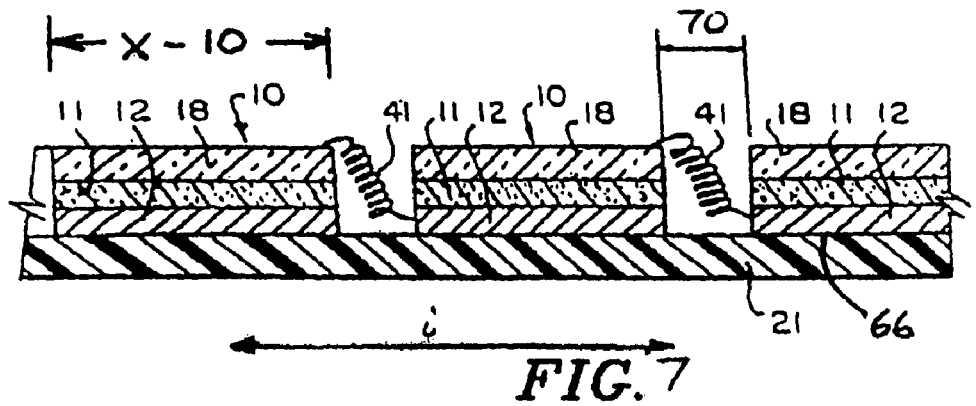
FIG. 7 is a sectional view illustrating the problems associated with making series connections among thin film photovoltaic cells shown in FIGS. 3-5.

Referring now to FIG. 7, there are illustrated cells 10 as shown in FIG. 4A. The cells have been positioned to achieve spatial positioning on the support substrate 21. Support structure 21 is by necessity non-conductive at least in that distance indicated by numeral 70 separating the adjacent cells 10. This insulating space prevents short circuiting from metal foil structure 12 of one cell to foil structure 12 of an adjacent cell. In order to achieve series connection, electrical communication must be made from the top surface of window electrode 18 to the foil structure 12 of an adjacent cell. This communication results in a net current flow in the direction of the arrow identified as "i" in FIG. 7. This net current flow direction is substantially in the direction of width X-10 of photovoltaic cell 10. Electrical communication from top surface of window electrode 18 to the foil structure 12 of an adjacent cell is shown in FIG. 7 as a metal wire 41. It is noted that foil structure 12 is normally relatively thin, on the order of 0.001 cm to 0.025 cm. Therefore connecting to its edge as indicated in FIG. 7 would be impractical for inexpensive continuous production and is shown for illustration purposes only. Further, discrete electrical connections to the bottom of foil structure 12, as suggested in the "string and tab" arrangement depicted in FIGS. 1A-1C, is also inconvenient for high volume, rapid interconnection of photovoltaic cells since these connections to the bottom surface must be made individually prior to final assembly of the interconnected cells into a fixed modular arrangement.

Figure 8:
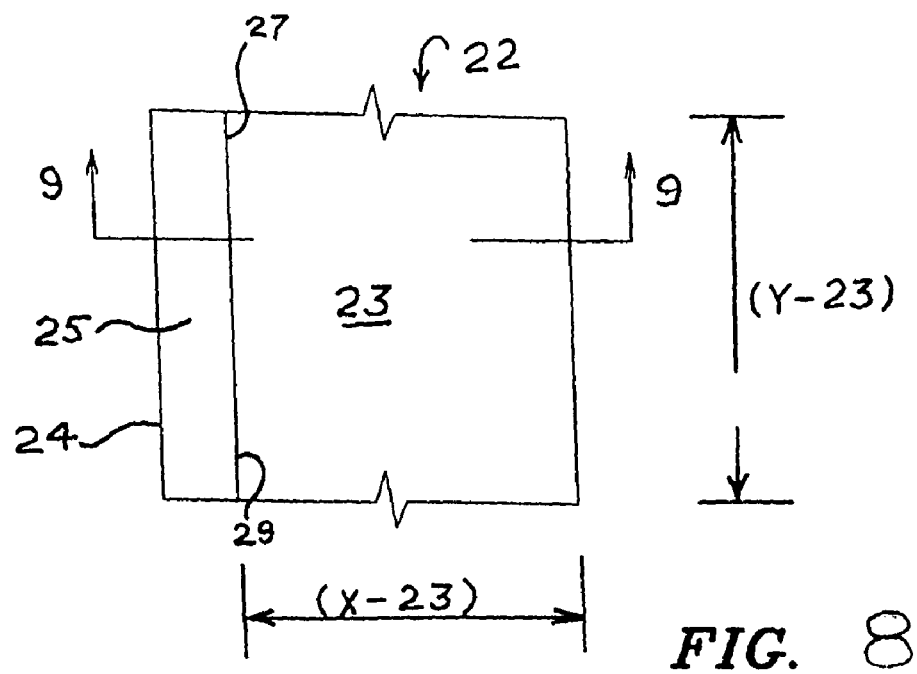
FIG. 8 is a top plan view of an embodiment of a substrate structure for achieving series interconnections of thin film photovoltaic cells.
Figure 9:
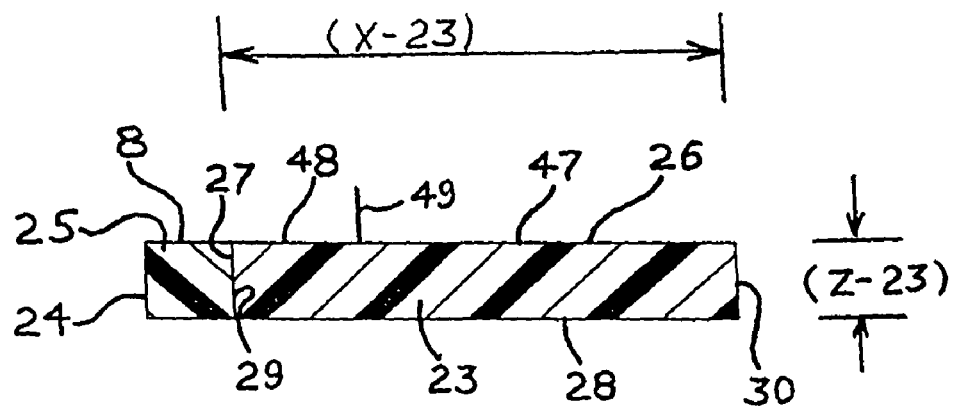
FIG. 9 is a sectional view taken substantially along the line 9-9 of FIG. 8.

Referring now to FIGS. 8 and 9, one embodiment of the interconnecting substrate structures of the current invention is generally indicated by 22. As depicted in the FIGS. 8 and 9 embodiments, unit of substrate has a substantially planar upper surface having surface dimensions much greater than thickness dimension Z-23 and thus unit 22 can be characterized as having a sheetlike form. Unit of substrate 22 comprises electrically conductive material 23. Unit of substrate 22 also comprises electrically insulating material 25. Material 25 normally comprises a polymeric material. However, other insulating materials such as wood or glass could serve the insulating function in some applications. Material 25 has non-conductive top surface 8. Non-conductive top surface 8 extends between a first terminal edge 24 and second terminal edge 27. Electrically conductive material 23 has a top side conductive surface portion 26 extending between a first terminal edge 29 and a second terminal edge 30 of conductive top surface 26. Width X-23 defines first and second terminal edges 29 and 30 respectively of conductive top surface portion 26. Electrically conductive material 23 also has a bottom surface 28, length Y-23 and thickness Z-23. Top conductive surface portion 26 of conductive material 23 may be thought of as having top collector surface 47 and top contact surface 48 separated by imaginary insulating boundary 49.

Figure 9A:
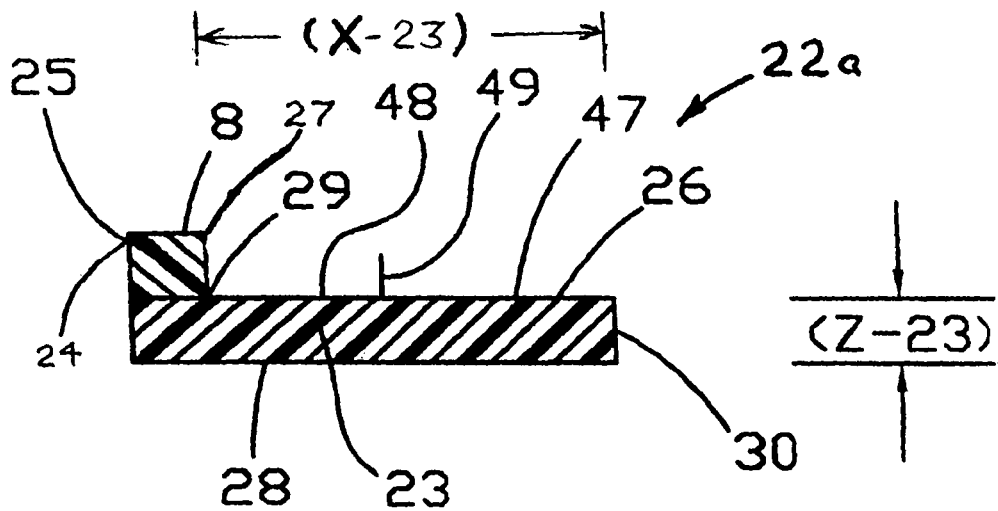
FIG. 9A is a sectional view of an alternate embodiment of a substrate structure for achieving series interconnections among thin film photovoltaic cells.

An alternate embodiment of a discrete unit of substrate, indicated as 22a, is illustrated in FIG. 9A. In the FIG. 9A embodiment, the electrically insulating material 25 is positioned to overlay a portion of electrically conductive material 23. One understands that insulating material 25 may advantageously exhibit adhesive characteristics. Alternatively, an adhesive medium (not shown) may be disposed between insulating material 25 and conductive material 23. In this case, width dimension X-23 extending between terminal edges 29 and 30 of the conductive top surface 26 is less than the full width of electrically conductive material 23. The structure of substrate unit 22*a* embodied in FIG. 9A may have certain manufacturing advantages compared with the structure depicted in FIG. 9. It is clear that the relative extents of the conductive and non-conductive top surfaces of structure 22*a* may vary according to specific application.

Figure 9B:
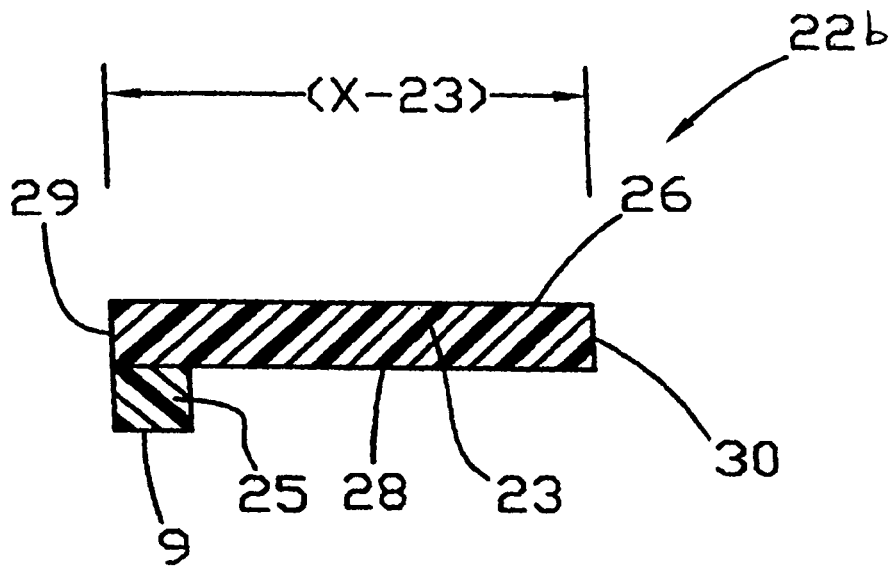
FIG. 9B is a sectional view of another embodiment of a substrate structure for achieving series interconnections among thin film photovoltaic cells.

A further embodiment of unit of substrate, indicated as 22*b*, is illustrated in FIG. 9B. In the FIG. 9B embodiment, the electrically insulating material 25 is positioned on the bottom surface 28 of electrically conductive material 23.

It is important to note that the thickness variations depicted in the sectional views of FIGS. 9A and 9B result from drawing scale and that small thickness variations of the actual article would not negate characterization of the articles as "sheetlike" or having substantially planar surfaces.

In the embodiments of FIG. 9 through 9B, electrically conductive material 23 may comprise forms of most of the well know electrically conductive materials such as metals or electrically conductive polymers. Typically, electrically conductive polymers exhibit bulk resistivity values of less than 10,000 ohm-cm. Resistivities less than 10,000 ohm-cm can be readily achieved by compounding well-known conductive fillers into a polymer matrix binder. Material 23 may alternatively comprise a metal foil or film.

Substrate units 22 through 22*b* may be fabricated in a number of different ways. Electrically conductive material 23 can comprise an extruded film of electrically conductive polymer joined to a strip of compatible insulating polymer 25 at or near terminal edge 29 as illustrated in FIG. 9. The structures embodied in FIGS. 9A and 9B may be formed by applying non-conductive material 25 to the top or bottom surface of conductive material sheet 23 respectively.

Figure 10:
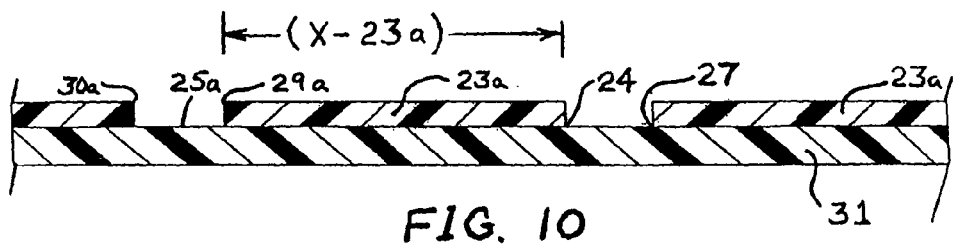
FIG. 10 is a sectional view showing an alternate embodiment of a substrate structure for achieving series interconnections of thin film photovoltaic cells.

Alternatively, the conductive material 23 may comprise a layer 23*a* applied to an insulating support structure 31 as illustrated in section in FIG. 10. For example, conductive material 23*a* of FIG. 10 may comprise a layer of electrically conductive polymer. In FIG. 10, electrically insulating regions 25*a* are simply those portions of insulating support structure 31 not overlaid by conductive material 23*a*. It is seen that the embodiment of FIG. 10 consists of repetitive units, each unit comprising a conductive top surface region and a non-conductive top surface region.

It is contemplated that electrically conductive material 23, 23*a*, etc. may comprise multiple materials. For example, a metal may be electrodeposited onto an electrically conductive polymer for increased conductivity and electrical joining characteristics. Metals such as silver, copper, nickel, zinc, tin and chromium can be electrodeposited quickly and inexpensively. The thicknesses of electrodeposited metals can be closely controlled over a wide range, from for example 0.1 to hundreds of micrometers (i.e. 0.1 micrometer, 1 micrometer, 10 micrometer, 100 micrometer) to hundreds of micrometers. Thus, an electrodeposited metal may be produced as the electrical equivalent of a bulk metal foil.

When considering electroplating, the use of a directly electroplateable resin (DER) may be particularly advantageous. DER's cover with metal rapidly by lateral growth of electrodeposit. In addition, selective metal coverage of a multi-material structure is readily achieved when one of the materials is DER. For example, were conductive material 23 shown in FIG. 9 to comprise a DER, exposing the FIG. 9 structure to an electroplating bath would result in rapid metal electrodeposition of conductive material 23 only while insulating material 25 would remain unplated. The fact that DER's are readily fabricated either as bulk compositions or coatings qualifies DER's as being eminently suitable in this application.

Figure 11:
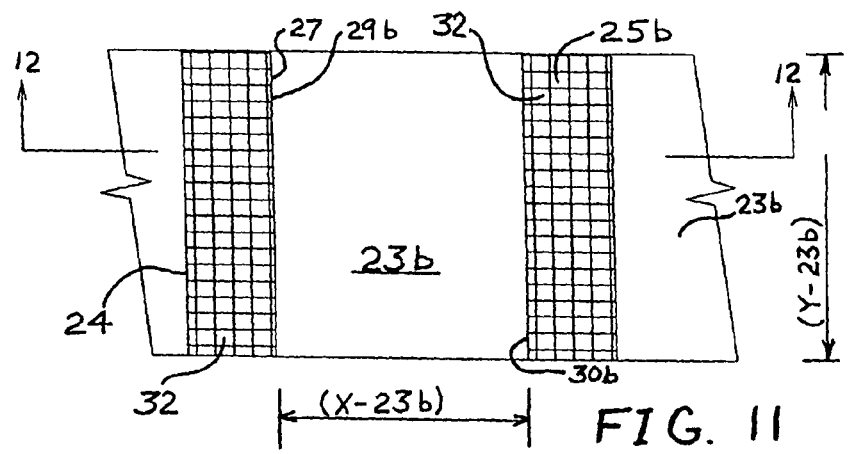
FIG. 11 is a top plan view of an alternate embodiment of a substrate structure for achieving series interconnections of thin film photovoltaic cells.
Figure 12:
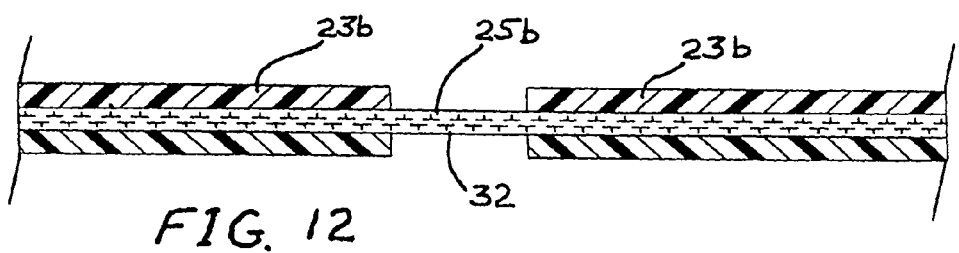
FIG. 12 is a sectional view taken substantially along the line 12-12 of FIG. 11.

A further embodiment of interconnecting substrate is illustrated in FIGS. 11 and 12. In FIG. 11, electrically conductive material 23*b* comprises electrically conductive polymer coating or impregnated into a fabric or web 32. A number of known techniques can be used to achieve such coating or impregnation. Insulating joining region 25*b* in FIG. 11 is simply an uncoated portion of the web 32. Thus, the FIGS. 11 and 12 embodiment consists of repetitive units, each unit comprising a conductive top surface region and a non-conductive surface region. Fabric or web 32 can be selected from a number of woven or non-woven fabrics, including non-polymeric materials such as fiberglass. Alternatively, the material forming 23*b* may comprise a fabric structure formed from a material which is itself conductive or capable of facilitating a subsequent metal deposition. Typical materials such as a fabric of metal or DER fibrils or a catalyzed ABS may be appropriate. In this case optional subsequent metal deposition would produce a highly conductive, monolithic surface to material 23*b*.

Referring to the group of embodiments of interconnecting substrate structure of FIG. 9 though 12, they all have a length indicated as the "Y" dimension. It is contemplated in all cases that the length may be much greater than a width and the structures may be manufactured and further processed using continuous processing. Should the structures be suitably flexible, roll-to-roll processing is further contemplated.

Figure 13:
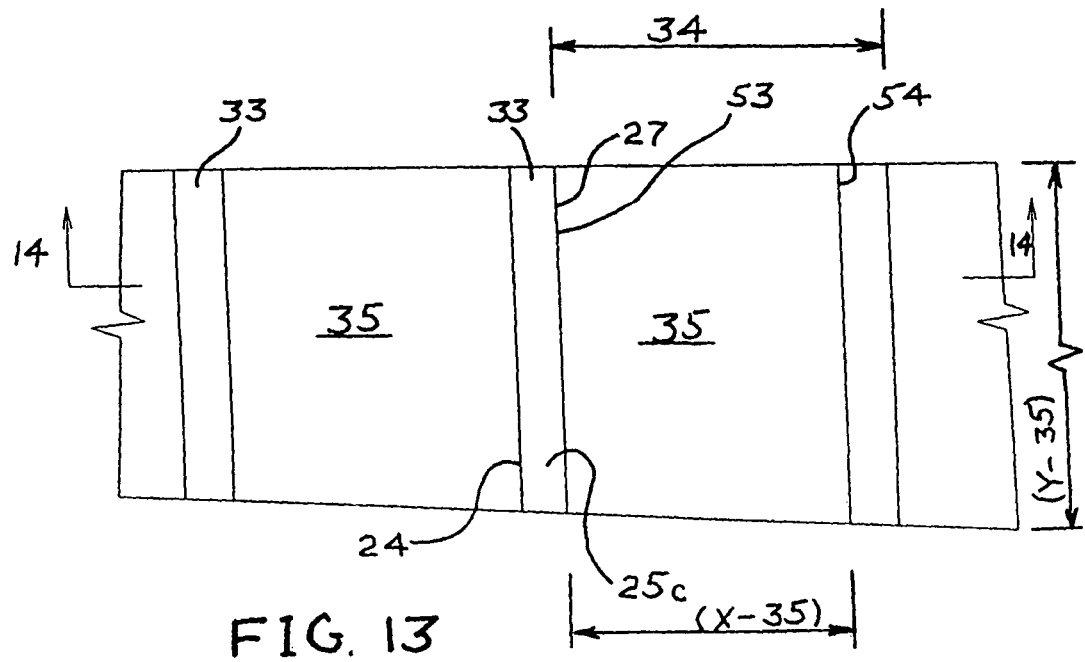
FIG. 13 is a top plan view of another embodiment of a substrate structure for achieving series interconnections of thin film photovoltaic cells.

Referring now to FIG. 13, an alternate embodiment for the substrate structures of the present invention is illustrated. In the FIG. 13 embodiment, an insulating web or film 33 extends among and contributes to multiple individual units, generally designated by repeat structure 34. In the FIG. 13 embodiment, electrically conductive material 35 is positioned repetitively on sheetlike insulating web or film 33. At the stage of overall manufacture illustrated in FIG. 13, electrically conductive material sheets 35 may simply comprise a metal foil. Using conductive monolithic sheets such as a "bulk" metal foil may have certain manufacturing advantages such as ease of preparation. It is readily understood that the electrically conductive material sheets 35 are analogous to and serve the same purpose as conductive material sheets 23 of FIGS. 8 through 12. The electrically conducting material sheets 35 normally will be attached to the insulating web or film 33 with integrity required to maintain positioning and dimensional control. This attachment may be accomplished with an adhesive, indicated by material 36 of FIG. 14.

Figure 14:
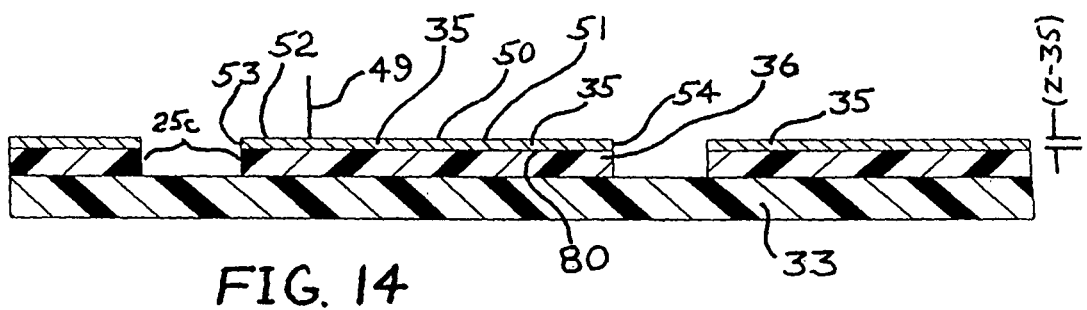
FIG. 14 is a sectional view taken substantially along the line 14-14 of FIG. 13.

Conductive material sheets 35 are shown in FIGS. 13 and 14 as having length Y-35, width X-35 and thickness Z-35. It is contemplated that length Y-35 may be considerably greater than width X-35 and length Y-35 can generally be described as "continuous" or being able to be processed in roll-to-roll fashion. Width X-35 defines a first terminal edge 53 and second terminal edge 54 of conductive material sheet 35.

It is important to note that the thickness of the conductive material sheets 35, Z-35 must be sufficient to allow for continuous lamination to the insulating web 33 should such continuous lamination be employed. A bulk metal foil would normally be specified. More specifically, when using metal based foils for sheets 35, thickness between 2.0 micrometer and 0.025 cm. may normally be appropriate.

As with the substrate structures of FIGS. 8 through 12, it may be helpful to characterize top surface 50 of conductive material sheets 35 as having a top collector surface 51 and a top contact surface 52 separated by an imaginary barrier 49. Conductive material sheet 35 also is characterized as having a bottom surface 80.

Yet another way to produce structure equivalent to that embodied in FIGS. 13 and 14 is to choose material 36 of FIG. 14 to be a material which promotes metal deposition. This material would be deposited in a desired pattern. Subsequent processing then deposits a metal film over the surface of material 36 in the pattern defined by material 36. An example of such a suitable material 36 to perform this function would be a catalytically seeded ABS, which would catalyze chemical deposition of metal, such as is well known in the art. Chemical deposition of sufficient duration, or a combination of chemical deposition followed by electrodeposition, would result in a metal deposit having appropriate functionality as a "bulk" metal foil 35 described above in conjunction with FIGS. 13 and 14.

It is important to realize that the relative dimensions of the structures embodied in the sectional views of FIGS. 9, 9A, 9B, 10, 12, and 14 are not necessarily to scale. However, as is clear from the embodiments of FIGS. 9 through 14, it is anticipated that often these structures will have length and width dimensions (indicated by "Y" and "X' in FIGS. 8 through 14) far greater than the thickness dimension, and will be substantially "planar" or "sheetlike" in structure. While minor thickness variations may occur over the extended surface of the structures (as indicated for example in the sectional views of embodiments shown in 9A, 9B, 10, 12, 14) the overall surface topography of the structures is substantially "planar" or "sheetlike". Also, these various structures may often be characterized as flexible. A material structure is considered flexible if it deforms in response to the application of force yet returns to substantially its original shape when the force is removed. In many cases the length may far exceed the width such that the structures may be processed in a continuous roll-to-roll fashion in the length direction. Finally, obvious variants of the materials of construction and structures described for the various embodiments of FIGS. 9, 9A, 9B, and 10 through 14 are considered to be within the scope of the instant invention.

It is readily realized that the photovoltaic cell structure of FIGS. 3 through 5 may be initially prepared separate and distinct from the interconnecting substrate structures taught in FIGS. 8 through 14. This initial separation allows elevated temperature processing of cell structure, possibly in bulk and having expansive surfaces, while permitting design of unique polymer containing interconnect substrate structures. The polymer containing substrates can be made flexible and be processed in continuous roll-to-roll fashion. In addition, the use of interconnecting substrates supplied separately and after manufacture of cell structure permits facile cell interconnection as will be taught in the following.

Figure 15A:
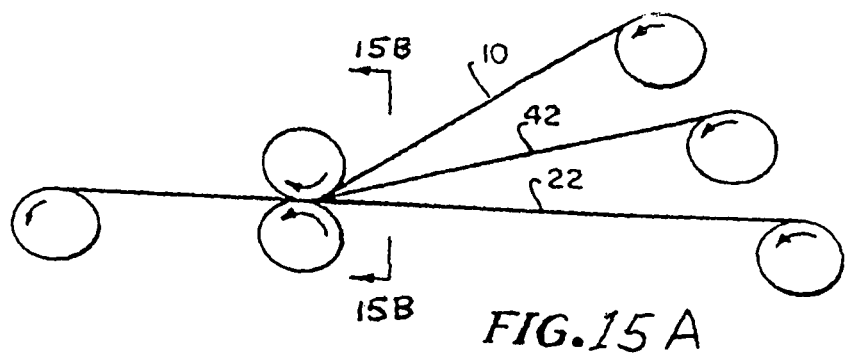
FIG. 15A is a side view depiction of a process for combining the foil supported thin film photovoltaic structure of FIGS. 3 through 5 to an interconnecting substrate structure.
Figure 15B:
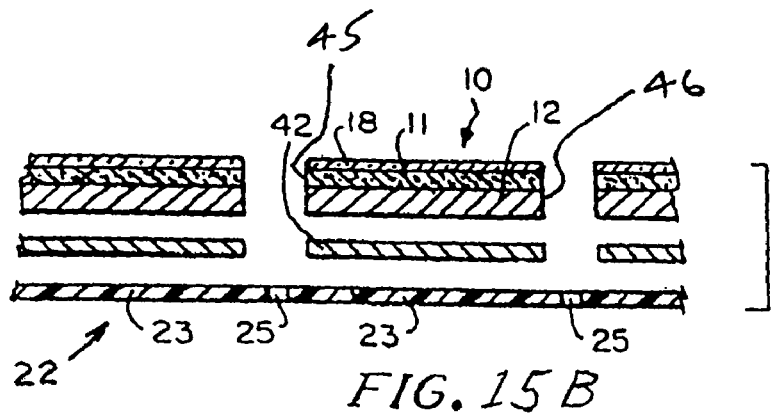
FIG. 15B is a sectional view taken substantially along line 15B-15B of FIG. 15A.

Referring now to FIGS. 15A and 15B, a process is shown for combining a continuous metal-based foil supported thin film photovoltaic structure of FIGS. 3 through 5 with a continuous form of substrate structures taught in FIGS. 8 through 14. In the FIGS. 15A and 15B embodiment's continuous lamination is shown as one means to achieve the combination. Continuous roll lamination employing nip rollers as depicted in FIG. 15A has certain manufacturing benefits. However, one will understand that many other methods such as vacuum lamination or simple "layup" may be used to achieve the combination and the invention is not limited to the specific process embodiment of FIGS. 15A and 15B. In FIGS. 15A and 15B, photovoltaic cell structure as illustrated in FIGS. 3 through 5 is indicated by numeral 10. In this embodiment, cell structures 10 are shown to be in a "continuous" form in the machine direction. Substrate structures as taught in the FIGS. 8 through 14 are indicated by the numeral 22. In this embodiment, substrate structures 22 are shown to be supplied in a "continuous" form in the machine direction. Numeral 42 indicates an electrically conductive joining means such as an electrically conductive adhesive intended to join electrically conductive metal-based foil 12 of FIGS. 3 through 5 to electrically conductive material 23 of FIGS. 8 through 12 or electrically conductive sheets 35 of FIGS. 13 and 14. It will be appreciated by those skilled in the art that the conductive adhesive 42 shown in FIGS. 15A and 15B is one of but a number of appropriate conductive joining techniques which would maintain required ohmic communication. For example, it is contemplated that methods such as application of a conductive resin prior to lamination, spot welding, soldering, joining with low melt temperature alloys, crimped mechanical contacts and mechanical surface contacts maintained with surface pressure would serve as alternate methods to accomplish the electrically conductive joining illustrated as achieved in FIGS. 15A and 15B with a strip of conductive adhesive 42. Should material 23 itself include an adhesively active top surface portion, such as might be offered by an electrically conductive adhesive, the separate feed 42 might be eliminated. These equivalent methods can be generically referred to as conductive joining means. In FIG. 15B, the process of FIG. 15A is illustrated using the substrate of FIGS. 8 and 9.

It has been found that a particularly attractive conductive joining may be achieved through a technique described herein as a laminated contact. One structure involved in the laminated contact is a first portion of conductive structure which is to be electrically joined to a second conductive surface. The first portion comprises a conductive pattern positioned over a surface of a hot melt type of adhesive. A hot melt adhesive is one whose full adhesive affinity is activated by heating, normally to a temperature where the material softens or melts sufficiently for it to flow under simultaneously applied pressure. Many various hot melt materials, such as ethylene vinyl acetate (EVA), are well known in the art.

In the process of producing a laminated contact, the exposed surface of a conductive material pattern positioned on the surface of a hot melt adhesive is brought into facing relationship with a second conductive surface to which is electrically joining is intended. Heat and pressure are applied to soften the adhesive which then flows around edges or through openings in the conductive pattern to also contact and adhesively "grab" the exposed second surface portions adjacent the conductive pattern. When heat and pressure are removed, the adhesive adjacent edges of the conductive pattern now firmly fix features of conductive pattern in secure mechanical contact with the second surface.

Figure 33:
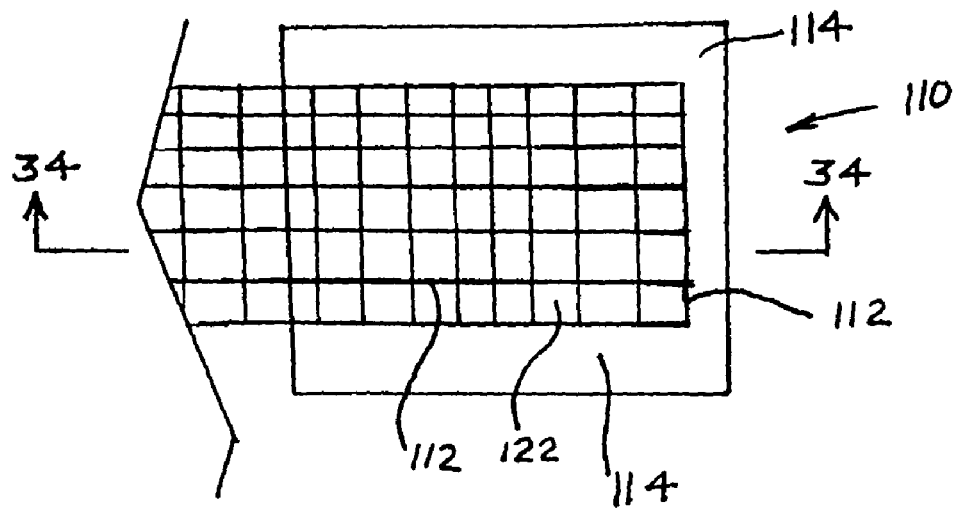
FIG. 33 is a top plan view of a structure suitable for achieving facile electrical connections.

The laminated contact is particularly suitable for the electrical joining requirements of many aspects of the instant invention. An embodiment of a starting structure to achieve laminated electrical joining is presented in FIGS. 33 and 34. FIG. 33 shows a top plan view of an article 110. Article 110 comprises a metal mesh 112 positioned on the surface of hot melt adhesive 114. Numeral 122 indicates holes through the mesh. One will realize that many different patterns of conductive material will be suitable for a laminated contact as taught here, including comb-like patterns, serpentine traces, monolithic metal mesh patterns, etc.

Figure 34:
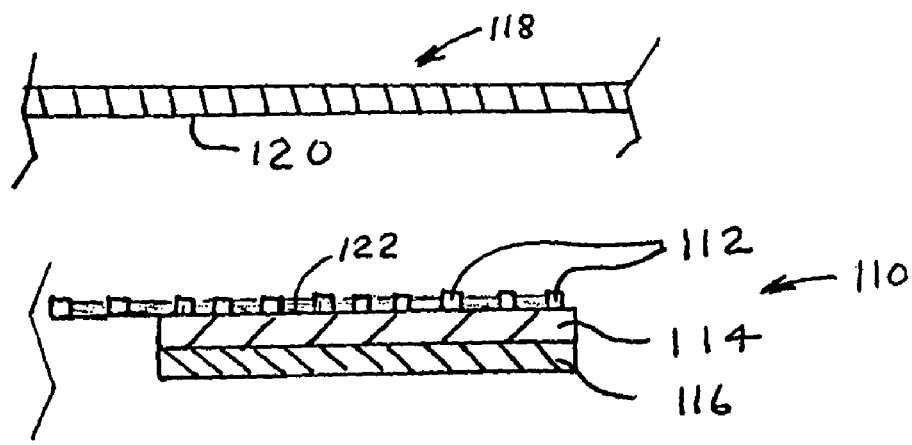
FIG. 34 combines a sectional view taken substantially from the perspective of lines 34-34 of FIG. 33 shown juxtaposed with an additional article prior to combination.

FIG. 34 show a sectional view of article 110 juxtaposed in facing relationship to a mating conductive surface to which electrical joining is desired. In the embodiment, article 110 is seen to be a composite of the conductive material pattern positioned on a top surface of hot melt adhesive film 114. In the embodiment, an additional support film 116 is included for structural and process integrity, and possibly barrier properties. Additional film 116 may be a polymer film of a material such as polyethylene terephthalate, polypropylene, polycarbonate, etc. Article 110 can include additional layered materials (not shown) to achieve desired functional characteristics. Also depicted in FIG. 34 is article 118 having a bottom surface 120. Surface 120 may represent, for example, the bottom surface 66 of solar cell structure 10.

In order to achieve the laminated contact, articles 110 and 118 are brought together in the facing relationship depicted and heat and pressure are applied. The adhesive layer softens and flows to contact surface 120. In the case of the FIG. 34 embodiment, flow occurs through the holes 122 in the mesh. Upon cooling and removal of the pressure, the metal mesh is held in secure and firm electrical contact with surface 120.

Figure 16A:
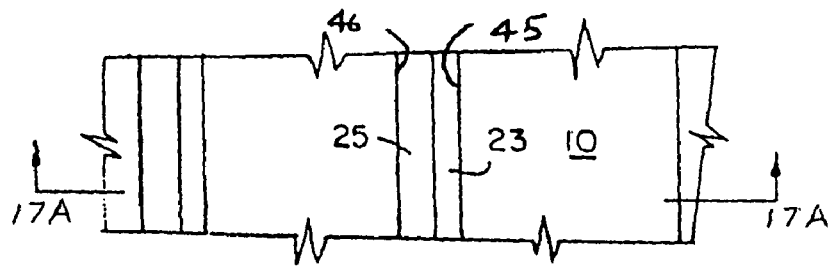
FIG. 16A is a top view of the structure resulting from the combination process of FIGS. 15A and 15B and using the substrate structure of FIG. 9.
Figure 16B:
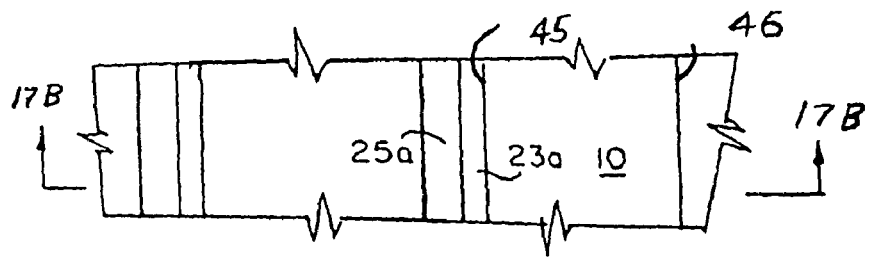
FIG. 16B is a top view of the structure resulting from the combination process of FIGS. 15A and 15B and using the substrate structure of FIG. 10.
Figure 16C:
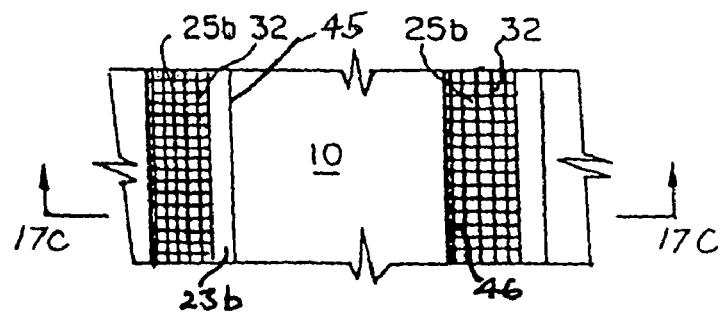
FIG. 16C is a top view of the structure resulting from the combination process of FIGS. 15A and 15B and using the substrate structure of FIG. 12.

Referring now to FIGS. 16 and 17, there is shown the result of the combination process of FIGS. 15A and 15B using the substrate structure of FIGS. 8 through 12. FIGS. 16A and 17A correspond to the substrate structures of FIGS. 8 and 9. FIGS. 16B and 17B correspond to the substrate structure of FIG. 10. FIGS. 16C and 17C correspond to the substrate structures of FIGS. 11 and 12. FIG. 17D corresponds to the substrate structure of FIG. 9A. FIGS. 17E and 17F correspond to the substrate structure of FIG. 9B.

FIGS. 16A through 16C show that the cells 10 have been positioned with first terminal edge 45 of one cell being substantially parallel to second terminal edge 46 of an adjacent cell.

Figure 17A:
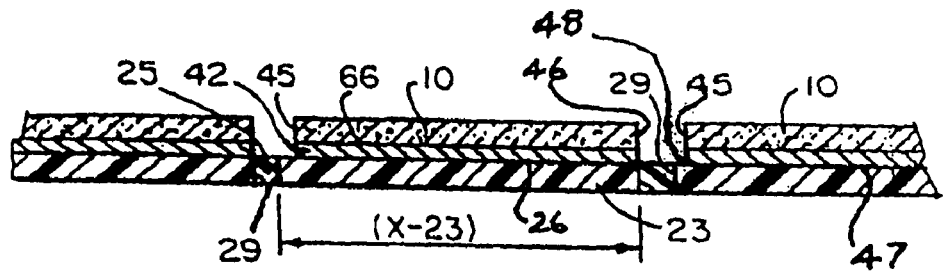
FIG. 17A is a sectional view taken substantially along the lines 17A-17A of FIG. 16A.
Figure 17B:
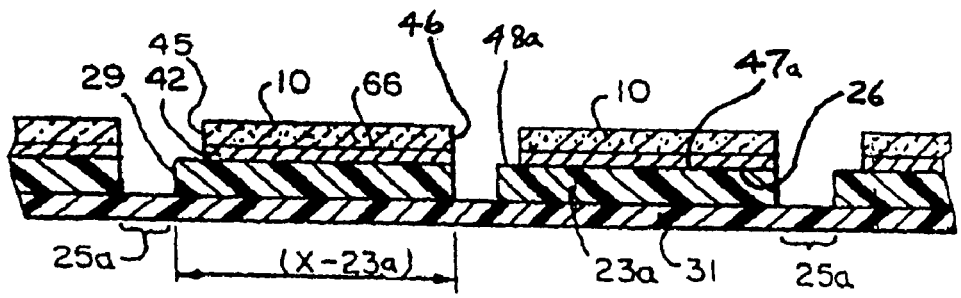
FIG. 17B is a sectional view taken substantially along the lines 17B-17B of FIG. 16B.
Figure 17C:
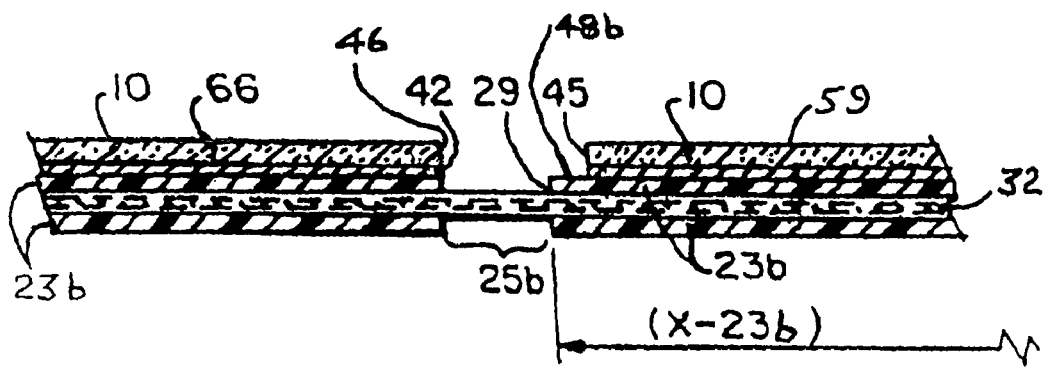
FIG. 17C is a sectional view taken substantially along the lines 17C-17C of FIG. 16C.
Figure 28:
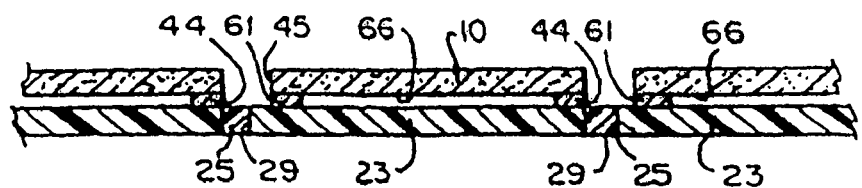
FIG. 28 is a sectional view similar to FIG. 17A but showing an alternate embodiment of the combined structure resulting from the combination process of FIG. 15.

In the FIGS. 17A, 17B and 17C, electrically conductive joining means 42 is shown as extending completely and contacting the entirety of the bottom electrode surface 66 of metal-based foil supported photovoltaic cells 10. Such broad contact surface may allow the use of a conductive adhesive having a relatively high intrinsic resistivity, such as those containing primarily carbon black or graphite fillers. This complete surface coverage is not a requirement however in cases where the conductive joining means joining surface 66 with surface 26 is highly conductive. Metal foil structure 12 is normally highly conductive and able to distribute current over the expansive width X-10 with minimal resistance losses. For example, the structure of FIG. 28 shows an embodiment wherein electrical communication is achieved between a conductive material sheet 23 of FIGS. 8 and 9 and bottom surface 66 of foil structure 12 through a narrow bead of a highly conductive joining means 61. Examples of such a highly conductive joining means would be a metal based solder or a silver filled epoxy. An additional joining means 44 may be used to ensure spatial positioning and dimensional support for this form of structure. Joining means 44 may comprise an adhesive and the adhesive need not be electrically conductive.

Figure 17D:
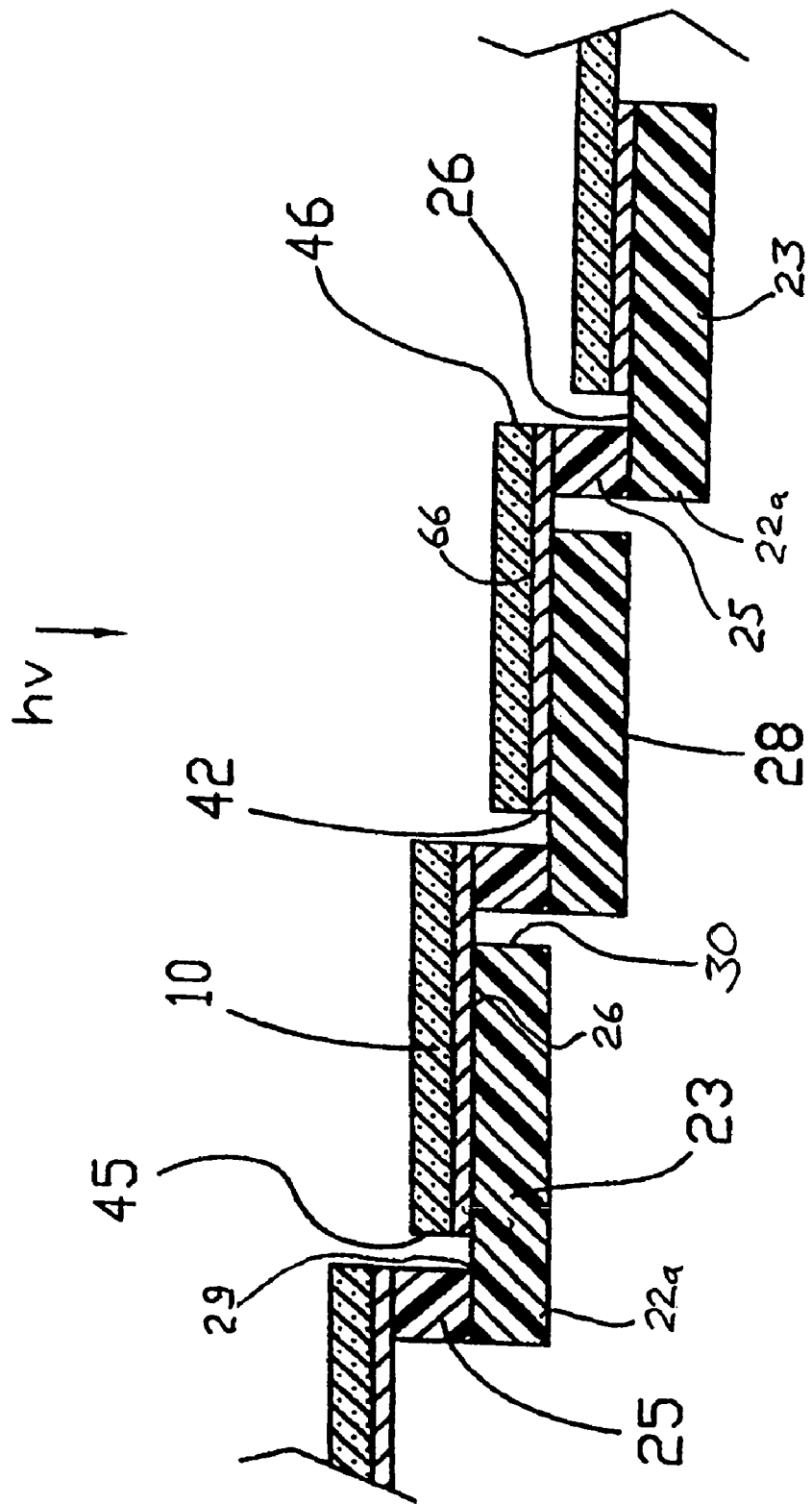
FIG. 17D is a sectional view similar to FIGS. 17A-17C illustrating an additional embodiment of structure resulting from a combining process such as that embodied in FIGS. 15A and 15B employing the substrate structure of FIG. 9A.

In FIG. 17D discrete units of substrate structure 22a are joined through cells 10. In addition an underlying insulating supporting material (not shown in FIG. 17D) may be used to facilitate spatial positioning of the multiple cells. In FIG. 17D, it is seen that the bottom surface 66 of an individual cell is in electrical communication with the conductive top surface 26 of conductive material 23 through conductive joining means 42 and is also attached to the nonconductive portion 25 of an adjacent unit of substrate. Conductive joining means 42 may comprise for example an electrically conductive adhesive. Electrically conductive joining means 42 is shown in FIG. 17D to extend completely over the bottom surface 66 of cells 10. This complete coverage is not required, as explained above.

Figure 17E:
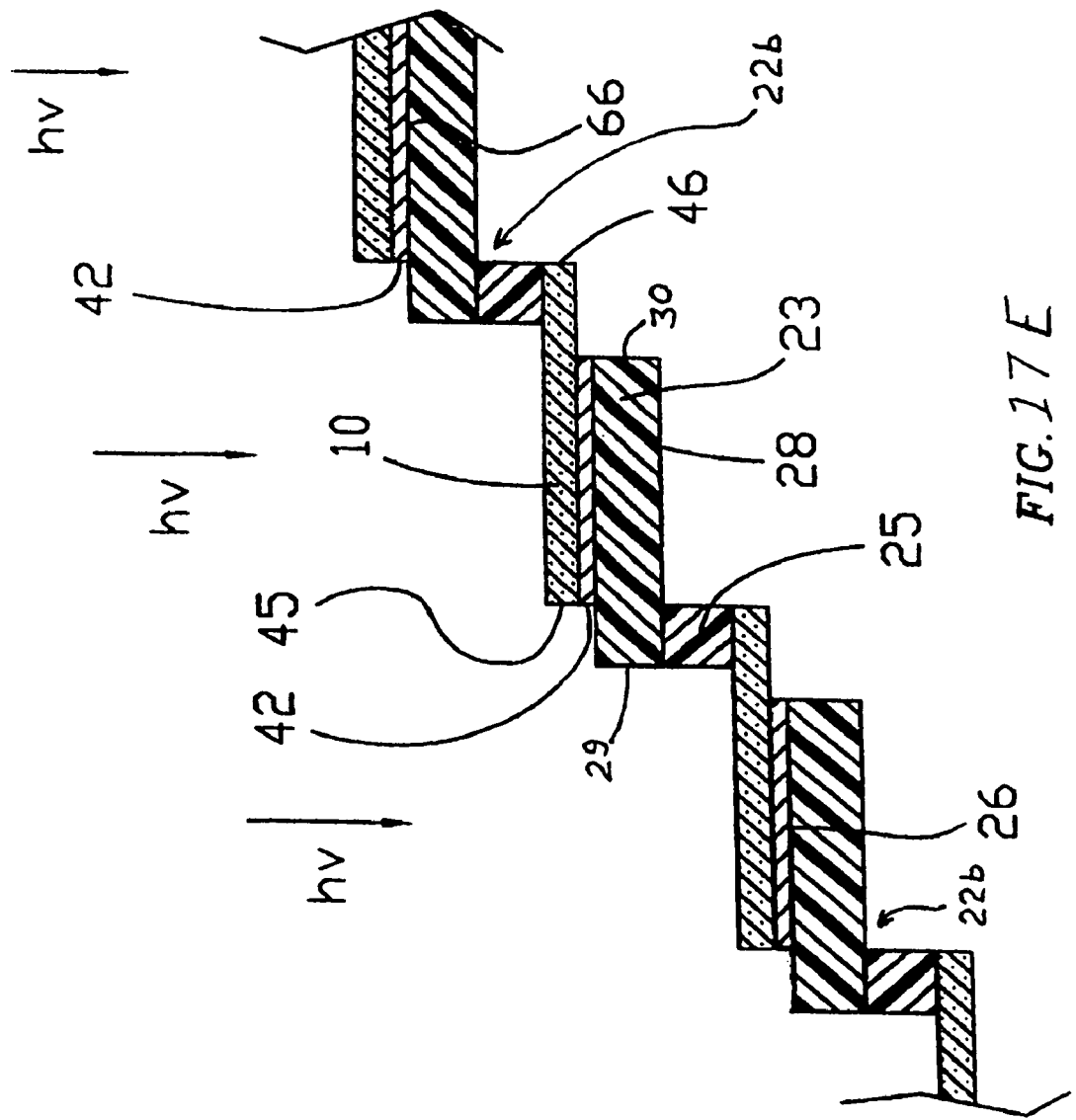
FIG. 17E is a sectional view similar to FIGS. 17A-17D illustrating an additional embodiment of structure resulting from the combination process of FIGS. 15A and 15B employing the substrate structure of FIG. 9B.
Figure 17F:
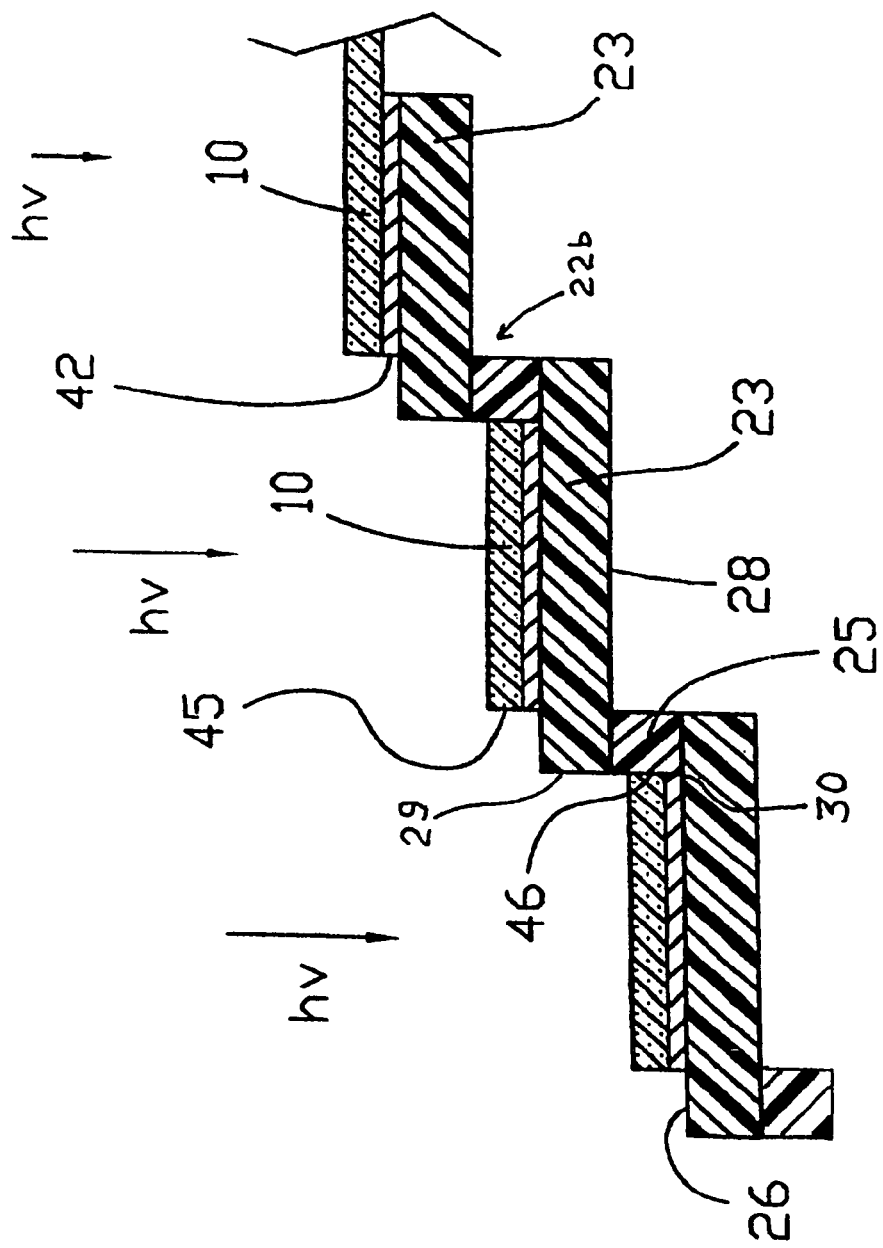
FIG. 17F is a sectional view similar to FIG. 17E employing a variation of the substrate structure of FIG. 9B.

In FIG. 17E, discrete units of substrate structure 22b are joined through cells 10. In FIG. 17F, multiple units of substrate structure 22b are joined in an overlapping fashion as embodied in the FIG. 17F. One will readily understand that, while the structural variations depicted in FIGS. 17A through 17F employ the substrate structures embodied in FIGS. 9 through 9B, structures similar or equivalent to those of FIGS. 17A through 17F could be prepared using the starting substrate structures of FIGS. 10 through 14.

Figure 29:
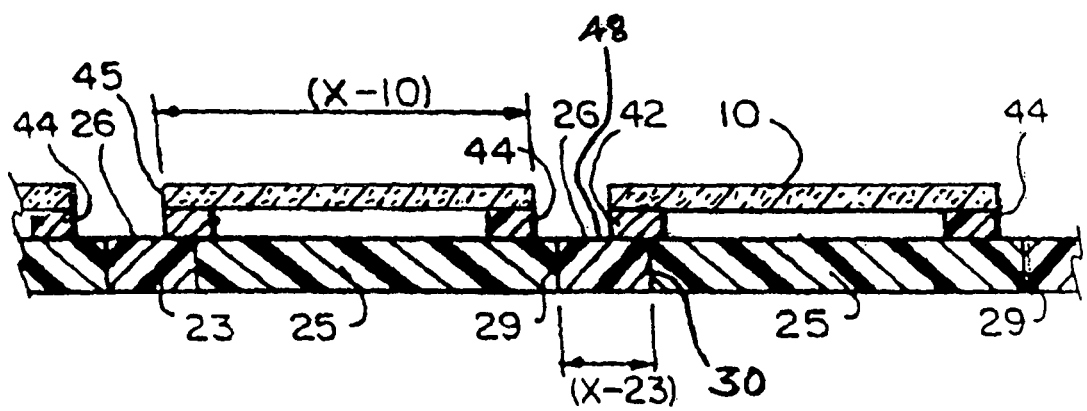
FIG. 29 is a sectional view similar to FIG. 17A but showing an alternate embodiment of the combined structure.

In the FIGS. 17A, 17B and 17C, the conductive materials 23, 23a and 23b are shown to be slightly greater in width X-23 than the width of foil X-10. As is shown in FIG. 29, this is not a requirement for satisfactory completion of the series connected arrays. FIG. 29 is a sectional view of a form of the substrate structures of FIGS. 8 and 9 combined by the process of FIG. 15A to the photovoltaic structures of FIGS. 3 through 5. In FIG. 29, width X-10 is greater than width X-23. Electrical communication is achieved through conductive joining means 42 and additional joining means 44 to achieve dimensional stability may be employed. A common feature of the embodiments of the current invention shown in FIGS. 17, 28, 29 and 31 is that the conductive material (23 or 35) of a substrate unit be electrically joined to the bottom electrode of a first cell 10 and also extend outward beyond a terminal edge (45 or 46) of that first cell. In this way individual cells can be positioned to overlay the substrate units using convenient processing such as laminating. The extension of the conductive material (23 or 35) beyond a terminal edge of the first cell essentially extends the bottom electrode of the first cell such that it is accessible from above. The conductive materials 23 or 35 of the substrate units are spaced apart from and do not actually extend to the top electrode of an adjacent cell. However, the extending material provides a convenient structure from which to form conductive paths to the top electrode of an adjacent cell, as will be seen.

Figure 32:
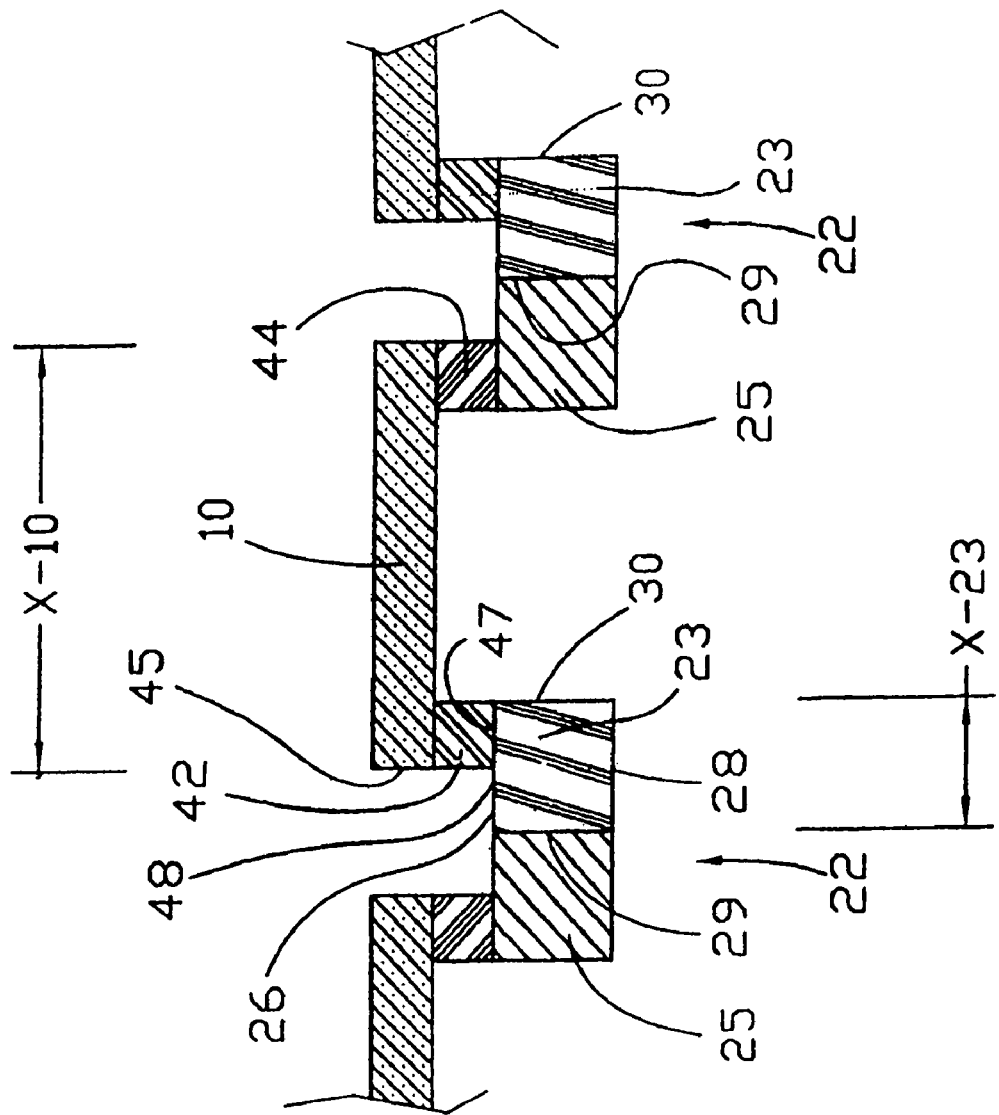
FIG. 32 is a sectional view of another embodiment of an article in the manufacture of series interconnected arrays.

In FIG. 29, insulating material 25 is shown as extending continuously from second terminal edge 30 of one conductive surface 26 to the first terminal edge 29 of an adjacent conductive surface. As shown in FIG. 32, this is not necessary. In FIG. 32, metal foil supported photovoltaic cell 10 is attached to a first conductive surface 26 through electrically conductive joining means 42 and also to insulating region 25 of an adjacent substrate structure through additional joining means 44. Additional joining means 44 may comprise for example a non-conductive adhesive. Thus, the substrate structure 22 may be discrete. In the embodiment of FIG. 32, the foil based photovoltaic structure 10 is of sufficient strength to maintain proper spaced relationships and positioning among cells. It is understood that additional support (not shown in FIG. 32) may be employed.

Figure 18:
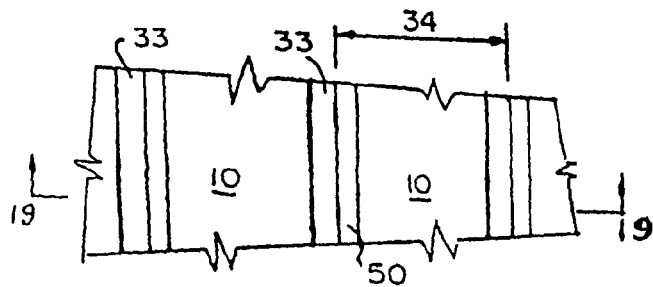
FIG. 18 is a top plan view of the structure resulting from the combination process of FIG. 15 and using the substrate structure of FIGS. 13 and 14.
Figure 19:
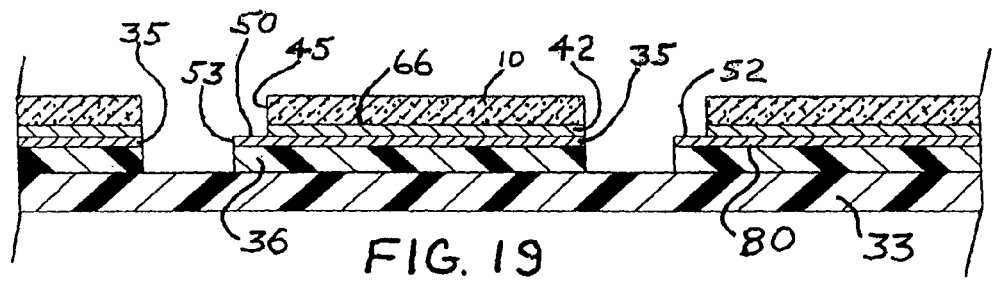
FIG. 19 is a sectional view taken substantially along the line 19-19 of FIG. 18.

Referring now to FIGS. 18 and 19, there is shown an alternate structure resulting from the combination process of FIG. 15A as applied to the photovoltaic cells of FIGS. 3 through 5 and the substrate structure of FIGS. 13 and 14. The first terminal edge 53 of conductive material sheets 35 supported by insulating web 33 are slightly offset from the first terminal edge 45 of photovoltaic cells 10. This offset allows a portion of top surface 50 of conductive material sheet 35 to be available for connecting to an electrode of an adjacent cell. Electrical and mechanical joining of conductive material sheets 35 with bottom surface 66 of metal-based foil structure 12 is shown in FIG. 19 as being achieved with conductive joining means 42 as in previous embodiments. As in previous embodiments it is contemplated that this electrical and mechanical joining can be accomplished by means such as conductive adhesives, soldering, joining with compatible low melting point alloys, spot welding, mechanical crimping, and mechanical pressure contacts.

Figure 30:
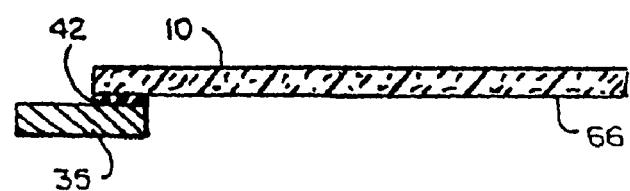
FIG. 30 is a sectional view of an alternate embodiment.
Figure 31:
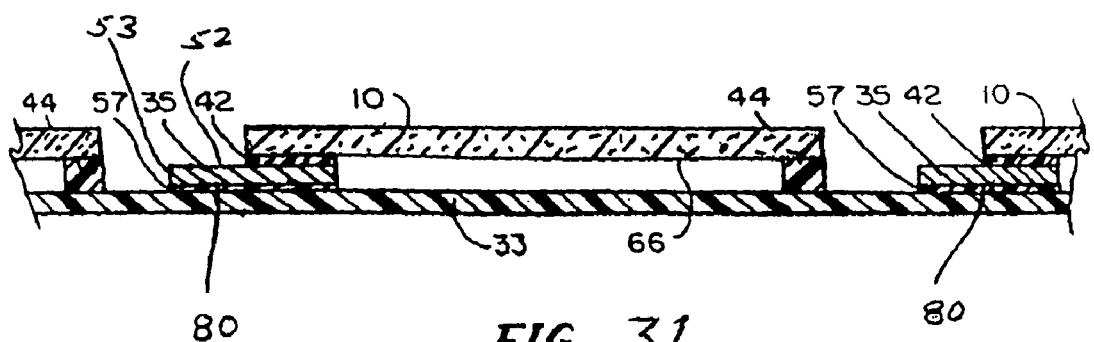
FIG. 31 is a sectional view of the embodiment of FIG. 29 after a further processing step.

It should also be observed that alternate process sequences may be used to produce structures equivalent to those shown in FIGS. 16 through 19, 28, 29 and 32. For example, a structure equivalent to that of FIGS. 18 and 19 can also be achieved by first joining photovoltaic cells 10 and conductive material sheets 35 with suitable electrically conductive joining means 42 to give the structure shown in FIG. 30 and laminating these strips to an insulating web or film 33. An example of such an equivalent structure is shown in FIG. 31, wherein the laminates of FIG. 30 have been adhered to insulating web 33 in defined repeat positions with adhesive means 57 and 44. As mentioned above and as shown in FIGS. 30 and 31, conductive material sheets 35 do not have to contact the whole of the bottom surface 66 of photovoltaic cell 10. In addition, insulating web 33 need not be continuous among all the cells.

Figure 20:
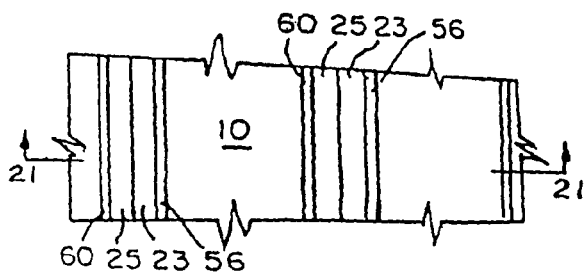
FIG. 20 is a top plan view of the structures of FIGS. 16A and 17A but following an additional step in manufacture of the interconnected cells.
Figure 21:
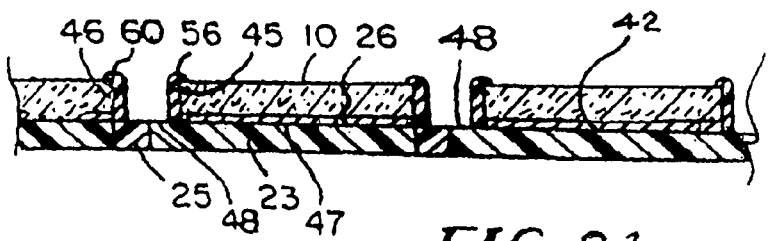
FIG. 21 is a sectional view taken substantially along the line 21-21 of FIG. 20.

Referring now to FIGS. 20 through 23, there is shown one method of forming the final interconnected array when employing the substrate structures embodied in FIGS. 8 and 9. In FIGS. 20 and 21, insulating materials 56 and 60 have been applied to the first and second terminal edges 45 and 46 respectively of photovoltaic cells 10. While these materials 56 and 60 are shown as applied to the structure of FIG. 17A, it is understood that appropriate insulating material are also envisioned as a subsequent manufacturing step for the structures of 17B-17F, 19, 28, 29, 31, and 32. The purpose of the insulating materials is to protect the edge of the photovoltaic cells from environmental and electrical deterioration. In addition, the insulating materials may help prevent electrical shorting when interconnections to be made among adjacent cells.

It is noted that the application of insulating material 56 to first terminal edge 45 of photovoltaic cells 10 effectively divides the top conductive surfaces 26 and 50 of conductive materials 23 and 35 respectively into two regions. The first region (region 48 of surface 26 or region 52 of surface 50) can be considered as a contact region for series interconnects among adjacent cells. The second region (region 47 of surface 26 or region 51 of surface 50) can be considered as the contact or collector surface for interconnecting the substrate to the bottom surface 66 of photovoltaic cells 10.

Figure 22:
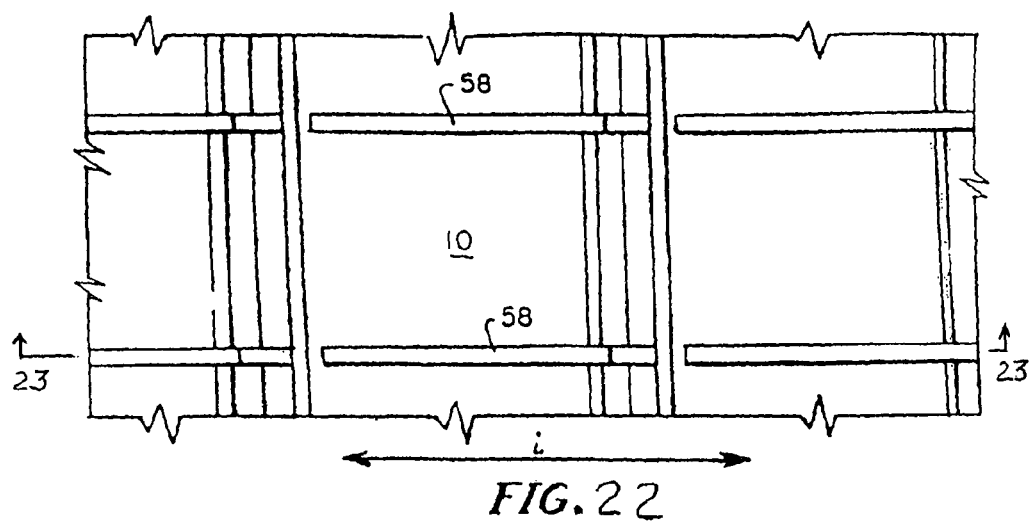
FIG. 22 is a top plan view of an embodiment of a completed interconnected array.
Figure 23:
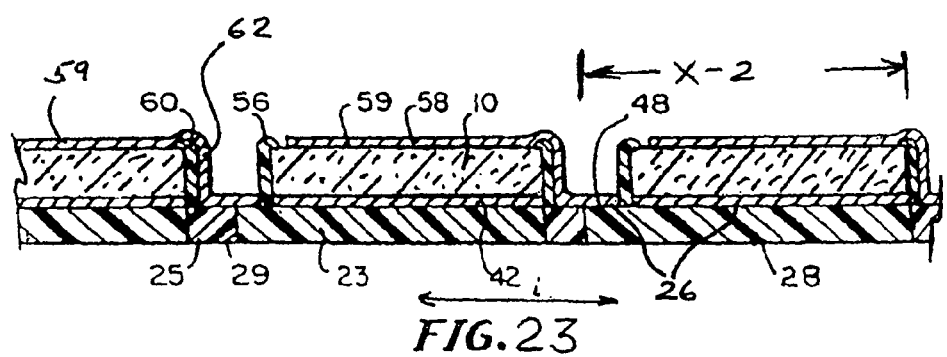
FIG. 23 is a sectional view taken substantially along line 23-23 of FIG. 22.

In the embodiment of FIGS. 22 and 23, grid fingers 58 of a highly electrically conductive material are deposited in the form of fingers to harvest current from the top surface 59 of the photovoltaic cell 10. Conductive extensions 62 convey the harvested current to the contact regions 48 or 52 associated with an adjacent cell. It is contemplated that the fingers can be deposited by any of a number of processes to deposit metal containing or metal-based foils or films, including masked vacuum deposition, printing of conductive inks, electrodeposition or combinations thereof. The grid fingers are not considered to be a part of the substrate structure since they do not contribute to supporting and spatial positioning of the cells. They serve only to harvest current from the top surface 59 of the cell. The conductive extensions 62 may be applied simultaneously with the fingers or in a separate operation. The extensions 62 may be applied using a number of processes to deposit metal containing or metal-based films identified above. Alternatively, the extensions may comprise a separately formed article such as a strip of bulk metal foil or mesh. In the embodiment of FIGS. 22 and 23, the direction of net current flow through the interconnected array illustrated is indicated by the arrow identified as "i", which direction is substantially parallel to width X-23 of electrically conductive surface portion 26 of unit of substrate 22.

Referring now to FIG. 24 and the exploded view of FIG. 24A, there are embodied alternate structures for the final interconnected array when employing the substrate structure as embodied in FIG. 9A. In FIG. 24, there is embodied multiple photovoltaic cells 10 positioned on interconnecting substrate units 22a as in FIG. 17D. FIG. 24A is an exploded view of the structure contained within the circle K of FIG. 24. A space identified as "P-24" separates individual cells. In addition, insulating materials 56 and 60 have been deposited over the terminal edges 45 and 46 of the individual cells. A conductive ink pattern forms a grid pattern of fingers 58 positioned on the top surface of the cell. Conductive extensions, electrically joined to the fingers 58 and identified by numeral 62, traverse over insulating material 60 and to the conductive top surface 26 of conductive material sheets 23. The conductive extensions 62 may be applied as described for the embodiment of FIGS. 22 and 23. Extensions 62 need not be the same material as fingers 58 nor need they be applied at the same time as fingers 58. Extensions 62 contact surface 26 using suitable conductive joining means (not shown) or through simple mechanical surface contact. In the FIGS. 24 and 24A embodiments, conductive material sheets 23 further communicate with conductive bottom surface 66 of an adjacent cell through electrically conductive joining means 42.

Referring now to FIG. 25 and the exploded view of FIG. 25A there is embodied another interconnected structure employing the substrate units of FIG. 9A. FIG. 25A is an exploded view of the structure contained within the circle L of FIG. 25. In FIGS. 25 and 25A there is embodied multiple photovoltaic cells positioned on units of interconnecting substrate 22a as in FIG. 17D. In the FIGS. 25 and 25A embodiment, conductive vias 72 establish communication between the top surface 59 of a cell 10 and the conductive material 23 of a unit of substrate 22a. Conductive material 103 fills the vias and makes electrical connection between the top surface 59 of cell 10 and conductive material 23. Conductive material 103 may comprise, for example, an electrically conductive resin, a metal plug or rivet or staple. Conductive material sheet 23 further communicates with conductive bottom surface 66 of an adjacent cell through electrically conductive joining means 42. The sidewalls of the via are insulated by material 104. The insulating material 104 prevents contact of the conductive material 103 traversing the via with the foil structure 12 of the cell through which the via extends. FIGS. 25 and 25A also shows optional grid fingers 58 extending from the conductive material of the vias over the top surface 59 of cells 10.

In the embodiment of FIGS. 25 and 25A, individual cells are separated by a gap, identified by "P-25". This gap may be very small. This structural aspect may be important where space is of concern in that the amount of illuminated surface lost through interconnecting is reduced compared to alternate arrangements.

Using conductive vias to achieve electrical communication between a cell top surface and a remote conductive material is known in the art. See for example Yoshida et al, U.S. Pat. No. 5,421,908, the entire contents of which are herein incorporated by reference. However, the Yoshida structure was essentially a monolithically integrated structure comprising thin conductive materials of limited current carrying capacity. In addition, a polymeric substrate was required to be present during initial cell manufacture in order to achieve the final interconnections. These factors and others significantly limited the Yoshida teachings.

One readily notes that the extensions 62 of the FIGS. 23 and 24 embodiments and vias 72 of FIG. 25 perform substantially the same function, that being to establish electrical communication between the top cell surface and the conductive material of sheet 23 of substrate unit 22a.

FIGS. 26 and 26A embody yet another structure for the final interconnected array employing the arrangement of FIG. 17D. FIG. 26A is an exploded view of the structure contained within the circle M of FIG. 26. In FIG. 26, insulating materials 60 and 56 protect edges of the cells. Also shown in FIGS. 26 and 26A is metal foil or metal containing mesh straps 73 extending from the conductive top surface of a first cell to the conductive material 23 of a unit of interconnecting substrate 22A. The "conductive joining means" connecting the strap to the conductive surfaces is not shown in the drawing but may be any of the number of conductive joining means previously identified. As shown in the FIG. 26 embodiment, such straps need not extend to the base electrode of one of the cells as is the case for the prior art arrangement embodied in FIG. 1. This facilitates assembly because a string of cells need not be "turned over" to make connection to the bottom electrode of an adjacent cell. Nor must any semiconductor material be removed to accomplish electrical joining to the bottom cell electrodes. Since there are a myriad of material and structural options to form the conductive surface region 26 of the interconnecting substrate unit of the instant invention, many different electrical joining techniques are available. Finally, the interconnecting substrate allows very high surface conductivity, thereby allowing current transport over an expansive surface of a back electrode while accomplishing secure positioning of the cells. This latter advantage permits facile and secure handling of multiple interconnected cells during final packaging of the multi-cell interconnected array.

Figure 27:
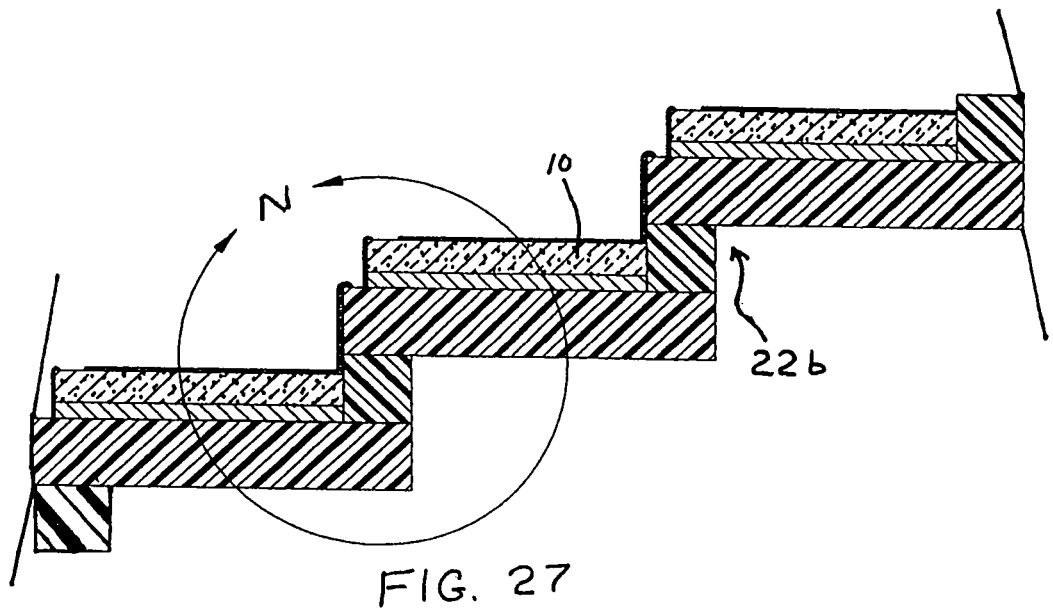
FIG. 27 is a sectional view similar to FIGS. 23-26 employing the interconnect substrate structure and cell combination of FIG. 17F to facilitate interconnection.
Figure 27A:
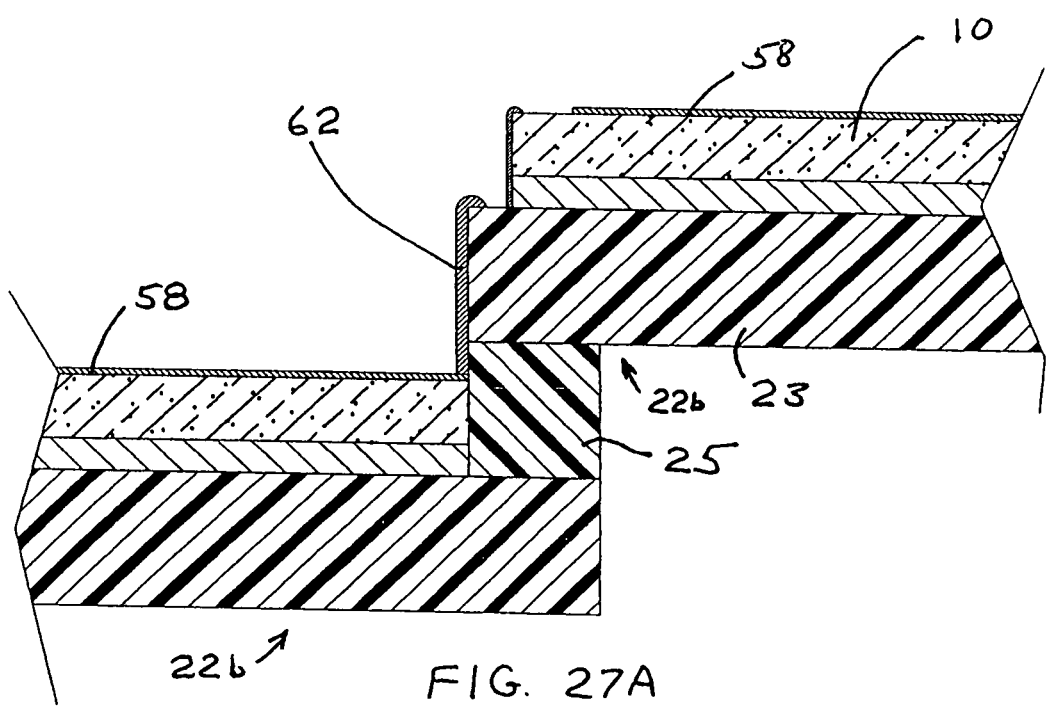
FIG. 27A is an exploded view of the structure contained within the circle N of FIG. 27.

Referring now to FIG. 27, a completed interconnected array is embodied using the substrate/cell arrangement embodied in FIG. 17F. FIG. 27A is an exploded view of the structure contained within the circle N of FIG. 27. In FIGS. 27 and 27A, electrical traces or "fingers" 58 positioned over the cell surface lead to a conductive extension 62. The extension 62 may be as described above in the description of FIGS. 24 and 24A. The extension 62 is further electrically joined to the conductive material 23 of a substrate unit associated with an adjacent cell. The FIG. 27 arrangement allows insulating material 25 associated with an individual substrate unit to also function as a protection for a terminal edge of the abutting cell.

One notes that in the interconnected cell embodiments of FIGS. 22 through 27, one notes that the conductive material 23 of a unit of interconnecting substrate extends outside a peripheral edge of the cell whose bottom surface 66 is electrically joined to material 23 of the particular unit. In this way an upward facing conductive surface of conductive material 23 is accessible for electrical connection to additional conductive material contributing to a conductive path extending to the top electrode of another adjacent cell. This condition greatly facilitates making the final series connections in an efficient, high speed and automated process.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. An article combining a first photovoltaic cell and interconnection substrate structure designed to promote facile series electrical and mechanical assembly of a multiple of said articles wherein, said first photovoltaic cell has structure comprising an upwardly facing top surface, said cell further comprising thin film semiconductor material supported on an upwardly facing surface of a metal based cell foil, said cell foil being self supporting, said interconnection structure comprises a first additional conductive material not associated with said photovoltaic cell structure, said cell foil overlays at least a portion of said additional conductive material, and said cell foil is not in ohmic electrical communication with said additional conductive material.

2. The article of claim 1 wherein said top surface comprises a transparent conductive material.

3. The article of claim 1 wherein said cell structure further comprises a conductive bottom surface.

4. The article of claim 1 wherein said metal based cell foil has a thickness between 5 and 250 micrometers.

5. The article of claim 1 wherein said metal based cell foil has properties allowing a roll-to-roll manufacturing step in the production of said cells.

6. The article of claim 1 wherein said metal based cell foil comprises a structure of multiple metal based layers.

7. The article of claim 1 wherein said additional conductive material comprises an electrodeposit.

8. The article of claim 1 wherein said additional conductive material comprises a second metal based foil.

9. The article of claim 8 wherein said second metal based foil has a thickness between 2 micrometers and 250 micrometers.

10. The article of claim 8 wherein said second metal based foil has properties suitable to allow continuous lamination.

11. The article of claim 1 wherein said additional conductive material comprises an electrically conductive polymeric resin.

12. The article of claim 1 further comprising additional non-conductive material not associated with said photovoltaic cell structure.

13. The article of claim 12 wherein said additional conductive and non-conductive materials are combined in a sheet like structure having a substantially planar upward surface.

14. The article of claim 12 wherein said non-conductive material is positioned between said additional conductive material and said metal based cell foil.

15. The article of claim 12 wherein said non-conductive material comprises a material having adhesive affinity for said additional conductive material.

16. The article of claim 12 wherein said additional non-conductive material comprises a polymeric adhesive.

17. The article of claim 12 wherein said first cell structure further comprises a conductive bottom surface and wherein a portion of said non-conductive material is in direct material contact with said bottom surface, the total area of said material contact being less than the total area of said first cell bottom surface, such that a portion of said first cell bottom surface remains exposed, thereby offering an accessible area to which electrical contact may be achieved.

18. The article of claim 12 wherein said additional nonconductive material comprises a material having adhesive affinity for said cell bottom surface.

19. The article of claim 17 wherein said first photovoltaic cell further has terminal edges defining boundaries of the first cell and wherein ohmic electrical communication is established between the first cell foil and an additional monolithic second conductive material extending outside the first cell boundary and wherein said additional monolithic conductive material remains separated from a top surface of an additional second cell and has an upwardly facing surface suitable for establishing facile electrical connection to an electrode of said second photovoltaic cell.

20. The article of claim 19 wherein said additional second conductive material extends beneath said second photovoltaic cell.

21. The article of claim 19 where one or more ohmic conductors electrically connect said upwardly facing surface of said additional second cell and said additional second conductive material extending outside the first cell boundary.

22. The article of claim 21 wherein one or more of said ohmic conductors comprise an electrically conductive polymeric resin.

* * * * *

US007898053C1

(12) EX PARTE REEXAMINATION CERTIFICATE (9335th)
United States Patent
Luch

(10) Number: US 7,898,053 C1
(45) Certificate Issued: *Oct. 4, 2012

(54) SUBSTRATE STRUCTURES FOR INTEGRATED SERIES CONNECTED PHOTOVOLTAIC ARRAYS AND PROCESS OF MANUFACTURE OF SUCH ARRAYS

(75) Inventor: Daniel Luch, Morgan Hill, CA (US)

(73) Assignee: Solannex, Inc., Morgan Hill, CA (US)

Reexamination Request:
No. 90/012,105, Jan. 25, 2012

Reexamination Certificate for:
Patent No.: 7,898,053
Issued: Mar. 1, 2011
Appl. No.: 12/799,863
Filed: May 4, 2010

( * ) Notice: This patent is subject to a terminal disclaimer.

Related U.S. Application Data

(63) Continuation-in-part of application No. 12/154,078, filed on May 19, 2008, now Pat. No. 7,732,243, which is a continuation-in-part of application No. 10/600,287, filed on Jun. 21, 2003, now abandoned, which is a continuation-in-part of application No. 10/144,901, filed on May 13, 2002, now abandoned, which is a continuation-in-part of application No. 09/498,102, filed on Feb. 4, 2000, now Pat. No. 6,459,032.

(51) Int. Cl.
*H01L 31/0224* (2006.01)

(52) U.S. Cl. ........ 257/448; 136/244; 136/252; 136/256; 257/E31.124; 257/E31.126

(58) Field of Classification Search ........................ None
See application file for complete search history.

(56) References Cited

To view the complete listing of prior art documents cited during the proceeding for Reexamination Control Number 90/012,105, please refer to the USPTO's public Patent Application Information Retrieval (PAIR) system under the Display References tab.

*Primary Examiner* — Pia Tibbits

(57) ABSTRACT

This invention comprises manufacture of photovoltaic cells by deposition of thin film photovoltaic junctions on metal foil substrates. The photovoltaic junctions may be heat treated if appropriate following deposition in a continuous fashion without deterioration of the metal support structure. In a separate operation, an interconnection substrate structure is provided, optionally in a continuous fashion. Multiple photovoltaic cells are then laminated to the interconnection substrate structure and conductive joining methods are employed to complete the array. In this way the interconnection substrate structure can be uniquely formulated from polymer-based materials employing optimal processing unique to polymeric materials. Furthermore, the photovoltaic junction and its metal foil support can be produced in bulk without the need to use the expensive and intricate material removal operations currently taught in the art to achieve series interconnections.

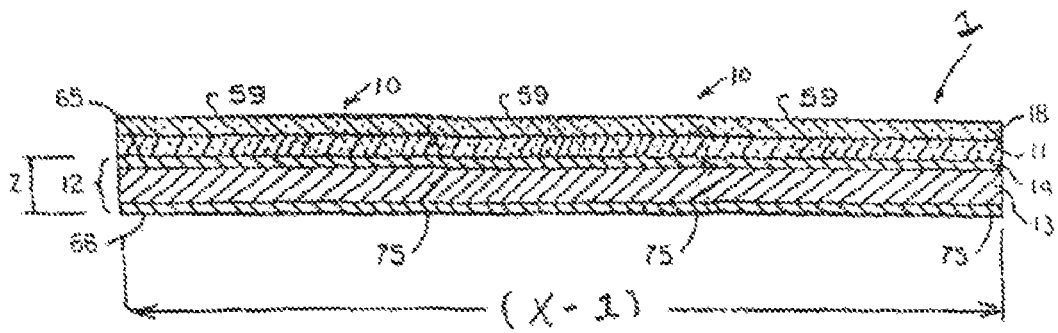

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-6, 8-10 and 12-22 are cancelled.

Claims 7 and 11 were not reexamined.

* * * * *